(12) United States Patent
Ren et al.

(10) Patent No.: US 8,865,995 B2
(45) Date of Patent: Oct. 21, 2014

(54) METHODS FOR HIGH FIGURE-OF-MERIT IN NANOSTRUCTURED THERMOELECTRIC MATERIALS

(75) Inventors: Zhifeng Ren, Newton, MA (US); Bed Poudel, Brighton, MA (US); Gang Chen, Carlisle, MA (US); Yucheng Lan, Newton, MA (US); Dezhi Wang, Wellesley, MA (US); Qing Hao, Cambridge, MA (US); Mildred Dresselhaus, Arlington, MA (US); Yi Ma, Somerville, MA (US); Xiao Yan, Brighton, MA (US); Xiaoyuan Chen, Acton, MA (US); Xiaowei Wang, Newton, MA (US); Joshi R. Giri, Allston, MA (US); Bo Yu, Allston, MA (US)

(73) Assignees: Trustees of Boston College, Chestnut Hill, MA (US); Massachusetts Institute of Technology, Cambridge, MA (US)

( * ) Notice: Subject to any disclaimer, the term of this patent is extended or adjusted under 35 U.S.C. 154(b) by 813 days.

(21) Appl. No.: 11/949,353

(22) Filed: Dec. 3, 2007

(65) Prior Publication Data
US 2008/0202575 A1     Aug. 28, 2008

Related U.S. Application Data

(63) Continuation-in-part of application No. 10/977,363, filed on Oct. 29, 2004, now Pat. No. 7,465,871.

(60) Provisional application No. 60/872,242, filed on Dec. 1, 2006.

(51) Int. Cl.
*H01L 35/34* (2006.01)
*H01L 35/16* (2006.01)
*H01L 35/22* (2006.01)

(52) U.S. Cl.
CPC ............... *H01L 35/16* (2013.01); *H01L 35/22* (2013.01)
USPC ............ 136/201; 136/238; 136/239; 136/240

(58) Field of Classification Search
USPC .................................. 136/201, 238, 239, 240
See application file for complete search history.

(56) References Cited

U.S. PATENT DOCUMENTS 3,164,892 A    1/1965   Lieberman et al.
3,285,017 A   11/1966   Henderson et al.
(Continued)

FOREIGN PATENT DOCUMENTS

CN    1375450 A    10/2002
DE   19627389 A1    1/1997
(Continued)

OTHER PUBLICATIONS

Schilz, J. et al., "Synthesis of thermoelectric materials by mechanical alloying in planetary ball mills", 1999, Powder Technology, 105, pp. 149-154.*

(Continued)

*Primary Examiner* — Tamir Ayad
(74) *Attorney, Agent, or Firm* — Nutter McClennen & Fish LLP

(57) ABSTRACT

Thermoelectric materials with high figures of merit, ZT values, are disclosed. In many instances, such materials include nano-sized domains (e.g., nanocrystalline), which are hypothesized to help increase the ZT value of the material (e.g., by increasing phonon scattering due to interfaces at grain boundaries or grain/inclusion boundaries). The ZT value of such materials can be greater than about 1, 1.2, 1.4, 1.5, 1.8, 2 and even higher. Such materials can be manufactured from a thermoelectric starting material by generating nanoparticles therefrom, or mechanically alloyed nanoparticles from elements which can be subsequently consolidated (e.g., via direct current induced hot press) into a new bulk material. Non-limiting examples of starting materials include bismuth, lead, and/or silicon-based materials, which can be alloyed, elemental, and/or doped. Various compositions and methods relating to aspects of nanostructured thermoelectric materials (e.g., modulation doping) are further disclosed.

20 Claims, 35 Drawing Sheets

(56) References Cited

U.S. PATENT DOCUMENTS

| | | | |
|---|---|---|---|
| 4,588,520 A | 5/1986 | Jayadev | |
| 5,069,868 A | 12/1991 | Tokiai et al. | |
| 5,246,504 A | 9/1993 | Ohta | |
| 5,318,743 A | 6/1994 | Tokiai | |
| 5,531,936 A | 7/1996 | Kanatzidis et al. | |
| 5,614,128 A | 3/1997 | Kanatzidis et al. | |
| 5,618,471 A | 4/1997 | Kanatzidis et al. | |
| 5,723,799 A | 3/1998 | Murayama et al. | |
| 5,763,293 A | 6/1998 | Yamashita et al. | |
| 5,883,563 A | 3/1999 | Horio | |
| 5,897,945 A | 4/1999 | Lieber et al. | |
| 5,929,351 A | 7/1999 | Kusakabe | |
| 5,965,841 A | 10/1999 | Imanishi | |
| 5,973,050 A | 10/1999 | Johnson et al. | |
| 5,989,487 A | 11/1999 | Yoo et al. | |
| 6,013,204 A | 1/2000 | Kanatzidis et al. | |
| 6,060,656 A | 5/2000 | Dresselhaus et al. | |
| 6,069,312 A | 5/2000 | Fleurial | |
| 6,147,293 A | 11/2000 | Trauchi | |
| 6,207,886 B1 | 3/2001 | Kusakabe | |
| 6,222,242 B1 | 4/2001 | Konishi | |
| 6,225,548 B1 | 5/2001 | Sakakibara et al. | |
| 6,235,981 B1 | 5/2001 | Miyoshi | |
| 6,274,802 B1 | 8/2001 | Fukuda | |
| 6,297,441 B1 | 10/2001 | Macris | |
| 6,312,617 B1 | 11/2001 | Kanatzidis et al. | |
| 6,313,392 B1 | 11/2001 | Sato | |
| 6,403,875 B1 | 6/2002 | Karino | |
| 6,440,768 B1 | 8/2002 | Konishi | |
| 6,444,896 B1 | 9/2002 | Harman et al. | |
| 6,525,260 B2 | 2/2003 | Yamashita | |
| 6,596,226 B1 | 7/2003 | Simard | |
| 6,605,772 B2 | 8/2003 | Harman et al. | |
| 6,617,504 B2 | 9/2003 | Kajihara | |
| 6,653,548 B2 | 11/2003 | Yamashita | |
| 6,670,539 B2 | 12/2003 | Heremans et al. | |
| 6,673,996 B2 | 1/2004 | Caillat | |
| 6,743,973 B2 | 6/2004 | Hayashi | |
| 6,840,844 B2 | 1/2005 | Miyashita et al. | |
| 6,858,154 B2 | 2/2005 | Suzuki et al. | |
| 7,002,071 B1 | 2/2006 | Sadatomi et al. | |
| 7,067,733 B2 | 6/2006 | Horio et al. | |
| 7,465,871 B2 | 12/2008 | Chen et al. | |
| 8,105,923 B2 | 1/2012 | Straboni | |
| 8,293,168 B2 | 10/2012 | Chen et al. | |
| 2002/0026856 A1 | 3/2002 | Suzuki et al. | |
| 2002/0053359 A1 | 5/2002 | Harman et al. | |
| 2002/0100499 A1 | 8/2002 | Hayashi | |
| 2002/0170590 A1 | 11/2002 | Heremans et al. | |
| 2003/0047204 A1 | 3/2003 | Fleurial et al. | |
| 2003/0089391 A1 | 5/2003 | Fukudome et al. | |
| 2003/0099279 A1 | 5/2003 | Venkatasubramanian et al. | |
| 2003/0168094 A1 | 9/2003 | Miyasita | |
| 2004/0187905 A1 | 9/2004 | Heremans et al. | |
| 2005/0284512 A1 | 12/2005 | Heremans et al. | |
| 2006/0053969 A1 | 3/2006 | Harada | |
| 2006/0102224 A1 | 5/2006 | Chen et al. | |
| 2006/0118158 A1 | 6/2006 | Zhang et al. | |
| 2006/0118161 A1 | 6/2006 | Horio | |
| 2006/0243314 A1 | 11/2006 | Ota | |
| 2006/0249704 A1 | 11/2006 | Ren | |
| 2006/0272697 A1 | 12/2006 | Kanatzidis et al. | |
| 2009/0068465 A1 | 3/2009 | Chen et al. | |

FOREIGN PATENT DOCUMENTS

| | | |
|---|---|---|
| EP | 1 187 230 A2 | 3/2002 |
| JP | 09-025526 A | 1/1997 |
| JP | 09-100166 A | 4/1997 |
| JP | 10-070315 A | 3/1998 |
| JP | 10-242535 A | 9/1998 |
| JP | 2000-261052 A | 9/2000 |
| JP | 2001-135870 A | 5/2001 |
| JP | 2002076452 A | 3/2002 |
| JP | 2003031860 A | 1/2003 |
| JP | 2003-251600 A | 9/2003 |
| JP | 2006-303427 A | 11/2006 |
| WO | WO-00/12600 A1 | 3/2000 |
| WO | WO-2004/055912 A1 | 7/2004 |
| WO | 2004/093202 A1 | 10/2004 |
| WO | 2006/062582 A2 | 6/2006 |
| WO | PCT/US2005/039362 | 1/2008 |

OTHER PUBLICATIONS

Rowe, D.M. et al., "Effect of grain size on the thermoelectric conversion efficiency of semiconductor alloys at high temperature", Sep. 1980, Applied Energy, vol. 6, Issue 5, abstract.*

Otake, Masatoshi et al., "Pulse-current sintering and thermoelectric properties of gas-atomized silicon-germanium powders", Jan. 2004, Solid State Ionics, 172, pp. 523-526.*

Yang, J. et al., "Thermoelectric properties of p-type $(Bi_2Te_3)_x(Sb_2Te_3)_{1-x}$ prepared via bulk mechanical alloying and hot pressing", Jun. 2000, Journal of Alloys and Compounds, 309, pp. 225-228.*

DiSalvo, Francis J., "Thermoelectric Cooling and Power Generation", Jul. 30, 1999, Science, vol. 285, pp. 703-706.*

J.M. Essick et al., "Conduction-and valence-band offsets at the hydrogenerated amorphous silicon-carbon/crystalline silicon interface via capacitance techniques". Phys. Rev. B. 54, 4885-4890. (1996).

J. M. Essick et al., "Band offsets and deep defect distribution in hydrogenated amorphous silicon-crystalline silicon heterostructures". Appl. Phys. Lett. 55, 1232-1234. (1989).

International Search Report, from PCT/US07/086291, mailed Nov. 16, 2009.

Invitation to Pay Addtl Fees w/ Partial International Search Report, from PCT/US07/086291, mailed Sep. 14, 2009.

Ni, H. et al., "Synthesis and Thermoelectric Properties of $Bi_2Te_3$ Based Nanocomposites," J. Alloys and Compounds 397(1-2):317-21 (2005).

Zhu, T. et al., "Nanostructuring and Thermoelectric Properties of Semiconductor Tellurides," Thermoelectrics, ICT 2007, 26th Intl Conf, IEEE p. 8-11 (Jun. 3, 2007).

Lauhorn, et a., "Epitaxial core-shell and core-multishell nanowire heterostructures", Nature, vol. 420, 2002.

Office Action of co-pending U.S. Appl. No. 12/273,783 dated Jul. 20, 2011.

Korean Office Action for Application No. 10-2009-7013824 issued Mar. 28, 2014 (7 Pages).

Chinese Office Action issued Dec. 17, 2013 for Application No. 201110461268.1 (14 pages).

[No Author Listed] Science vol. 271, "Small Clusters Hit the Big Time," 920-922 (Feb. 20, 1996).

Bennett, G.L., "Space Applications, in CRC Handbook of Thermoelectrics," Ed.D.M. Rowe, CRC Press, Boca Raton, pp. 515-537 (1995).

Bettotti et al., "Silicon nanostructures for photonics," J. Phys.: Condens. Matter 2002, 14, 8253-8281.

Borca-Tasciuc et al., "Thermal conductivity of symmetrically strained Si/Ge superlattices," Superlattices and Microstructures, vol. 28, pp. 119-206 (2000).

Borca-Tasciuc et al., "Thermal Conductivity of InAs/AlSb Superlattices," Microscale Thermophysical Engineering, 5, pp. 225-231 (2001).

Bostedt et al., "Evidence for cubic phase in deposited germanium nanocrystals," J. Phys.: Condens. Matter 2003, 15, 1017-1028.

Chen, G., "Size and Interface Effects on Thermal Conductivity of Superlattices and Periodic Thin-Film Structures," ASME Journal of Heat Transfer, vol. 119, pp. 220-229, 1997.

Chen, "Thermal conductivity and ballistic-phonon transport in the cross-plane direction of superlattices," Physical Revies B., 57, pp. 14958-14973, 1998.

Chen et al., "Heat Transfer in Nanostructures for Solid-State Energy Conversion," ASME Journal of Heat Transfer, 2002, 124, pp. 242-252.

(56) References Cited

OTHER PUBLICATIONS

Chen et al., "Recent Developments in Thermoelectric Materials," International Materials Reviews, vol. 48, p. 45-66, (2003).

Chinese Office Action issued Aug. 2, 2011 for Application No. 200780050809.3 (24 pages).

Das et al., "Self-assembled Ge nanostructures on polymer-coated silicon: Growth and characterization," Appl. Phys. Lett. 2000, 77, 951-953.

Ebbesen et al., "Large-scale synthesis of carbon nanotubes," Nature 1992, 358, 220-222.

Fang et al., "Nanocrystalline bismuth synthesized via an in situ polymerization-microemulsion process," Materials Letters, 42, pp. 113-120, 2000.

Fang et al., "Self-assembled bismuth nanocrystallites," Chemical Communication, pp. 1872-1873, 2001.

Foos et al., "Synthesis of Nanocrystalline Bismuth in Reverse Micelles," Journal of the American Chemical Society, 122, pp. 7114-7115, 2000.

Gerion et al., "Solution Synthesis of Germanium Nanocrystals: Success and Open Challenges," Nano Lett. 2004, 4, 597-602.

Ghamaty et al., "Thermal and Electrical Properties of $Si/Si_{0.8}Ge_{0.2}$ and $B_4C/B_9C$ Films," Proc. ICT98, pp. 206-209.

Goldsmid, "Thermoelectric Refrigeration," Plenum Press, New York, 1964.

Goodson et al., "Heat Conduction in Novel Electronic Films" Annual Review of Materials Science, 29, pp. 261-293, 1999.

Gudiksen et al., "Growth of nanowire superlattice structures for nanoscale photonics and electronics," Nature, 415, pp. 617-620, 2002.

Harman et al., "Thermoelectric Quantum-Dot Superlattices with High ZT," Journal of Electronic Materials, 29, pp. L1-L4, 2000.

Harman et al., "Quantum Dot Superlattice Thermoelectric Materials and Devices," Science 297, pp. 2229-2232 (2002).

Harris, et al., "Thermal Conductivity Reduction of SiGe Nanocomposites," pp. S7.21-S.7.2.6, Mat. Res. Soc. Symp. Proc. vol. 793 (2004).

Heremans et al., "Bismuth nanowire arrays: Synthesis and galvanomagnetic properties," Physical Review B, 61, pp. 2921-2930, 2000.

Heremans et al., "Thermopower Enhancement in Lead Telluride Nanostructures," Physical Review, vol. 70, p. 115334-1-115334-5, (Sep. 2004).

Hicks et al., "Effect of quantum-well structures on the thermoelectric figure of merit," Physical Review B, 47, pp. 12727-12731, 1993.

Hicks et al., "Experimental study of the effect of quantum-well structures on the thermoelectric figure of merit," Physical Review B, 53, 10493-10496, 1996.

Hohyun, Lee et al., "Thermoelectric properties of Si/Ge nano-composite" Thermoelectrics 2005, Jun. 10-23, 2005, pp. 269-271, XP010842911.

Hope-Weeks, "Time dependent size and shape control of germanium nanocrystals," Chem. Commun. 2003, 2980-2981.

Hsu et al., "Cubic $AgPb_mSbTe_{z+m}$: Bulk Thermoelectic Materials with High Figure Merit," Science, vol. 303, p. 818-821, (Feb. 2004).

Huang, et al., "The thermoelectric performance of $ZrNiSn/ZrO_2$ composites," Solid State Communications, Nov. 13, 2003.

Invitation to Pay Additional Fees mailed Oct. 23, 2007 for Application No. PCT/US2005/039362 (7 Pages).

International Search Report and Written Opinion mailed Jan. 28, 2008 for Application No. PCT/US2005/039362 (18 Pages).

International Preliminary Report on Patentability mailed Feb. 21, 2008 for Application No. PCT/US2005/039362 (9 Pages).

Ioffe, "Semiconductor Thermoelements and Thermoelectric Cooling, Infosearch Limited," London, 1957.

Jacquot et al., "Fabrication and Modeling of a Thermoelectric Microgenerator," 21.sup.st International Conference on Thermoelectroncis, pp. 561-564 (2002).

Johnson et al., "Growth and form of gold nanorods prepared by seed-mediated, surfactant-directed synthesis," J. Mater. Chem. 2002, 12, 1765-1770.

Kanatzidis, M.G., "New Bulk Materials for Thermoelectric Applications: Synthetic Strategies Based on Phase Homologies," Michigan State University (2003).

Kane et al., J. Phys. Chem., "Theoretical Study of the Electronic Structure of PbS Nanoclusters," 1996, 100, 7928-7932.

Koga et al., "Experimental proof-of-principle investigation of enhanced $Z_{3D}T$ in (001) oriented Si/Ge superlattices," Applied Physics Letters, 77, pp. 1490-1492, 2000.

Koga et al., "Mechanism of the enhanced thermoelectric power in (111)-oriented n-type $PbTe/Pb_{1-x}Eu_xTe$ multiple quantum wells," Phys. Rev. B., 1999, 60, 14286-14293.

Kornowski e tal., "nanometer-Sized Colloidal Germanium Particles: Wet-Chemical Synthesis, Laser-Induced Cyrstallization and Particle Growth," Adv. Mater. 1993, 5, 634-636.

Lai et al., "Melting point depression of Al clusters generated during the early stages of film growth: Nanocalorimetry measurements," Applied Physics Letters, 72, pp. 1098-1100 (1998).

Lam et al., "Large-scale synthesis of ultrafine Si nanoparticles by ball milling," Journal of Crystal Growth, 220, pp. 466-470 (2000).

Lao et al., "Hierarchical ZnO Nanostructures," Nano letters, pp. 1287-1291 (2002).

Lao et al., "Zn0 Nanobridges and Nanonails," Nano Lett. 2003, 3, 235-238.

Li et al., "$MoS_2$ nanoflowers and their field-emission properties," Appl. Phys. Lett. 2003, 82, 1962-1964.

Lieber, "One-Dimensional Nanostructures: Chemistry, Physics & Applications," Solid State Communication, 107, pp. 607-616, 1998.

Lin et al., "Semimetal-semiconductor transition in $Bi_{1-x}Sb_x$ alloy nanowires and their thermoelectric properties," Applied Physics Letters, 81, pp. 2403-2405 (2002).

Lin et al., "Structural and optical properties of germanium nanoparticles," J. Appl. Phys. 2002, 91, 1525-1528.

Liz-Marsan et al., "Core-Shell Nanoparticles and Assemblies Thereof," Handbook of Surfaces and Interfaces of Materials edited by H.S. Nalawa, Academic Press, 189-237, 2001.

Lu et al., "Melting and superheating of low-dimensional materials," Current Opinion in Solid State and Materials Science, 5, pp. 39-44 (2001).

Lu et al., "Synthesis of Germanium Nanocrystals in High Temperature Supercritical Fluid Solvents," Nano Lett. 2004, 5 969-974.

Maeda et al., "Visible photoluminescence of Ge microcrystals embedded in $SiO_2$ glassy matrices," Appl. Phys. Lett. 1991, 59, 3168-3170.

Molin et al., "Electrochemical deposition of PbSe thin-films from aqueous-solutions," Thin Solid Films, 265, pp. 3-9, 1995.

Morales et al., "A Laser Ablation Method for the Synthesis of Crystalline Semiconductor Nanowires," Science, 279, pp. 208-211, 1998.

Morup et al., "Crystal growth and the steady-state grain size during high-energy ball-milling," Europhysics Letters, 56, pp. 441-446 (2001).

Mrotzek et al,. "Search for New Thermoelectric Materials through Exploratory Solid State Chemistry. The Quaternary Phases $A_{1+x}M_{3-2x}Bi_{7+x}A_{1-x}M_{3-x}Bi_{11-x}Se_{20}$, $A_{1-x}M_{3-x}Bi_{11+x}Se_{21}$ and $A_{1-x}M_{5-x}Bi_{11+x}Se_{22}$ (A=K, Rb, Cs, M=Sn, Pb) and the Homologous Series $A_{M[M_6Se_6]_m[M_{5+n}Se_{9+n}]}$" MRS Proceedings691, pp. G.5.1.1-G.5.1.12 (2001).

Mulvaney et al., "Surface Chemistry of Colloidal Gold—Deposition of Lead and Accompanying Optical Effects," Journal of Physical Chemistry, 96, pp. 10419-10424, 1992.

Mulvaney et al., "Silica encapsulation of quantum dots and metal clusters," Journal of Materials Chemistry, 10, pp. 1259-1270, 2000.

Murray et al., "Synthesis and Characterization of Nearly Monodisperse CdE (E=S, Se, Te) Semiconductor Nanocrystallites," J. Am. Chem. Soc. 1993, 115, 8706-8715.

Murray et al.,"Synthesis and Characterization of Monodisperse Nanocrystals and Close-Packed Nanocrystal Assemblies," Annual Review of Materials Science, 30, pp. 545-610, 2000.

(56) References Cited

OTHER PUBLICATIONS

Ngiam et al., J. Appl. Phys.. "Synthesis of Ge nanocrystals embedded in a Si host matrix," 76, 8201-8203 (1994).
Ohnaka, et al., Thermoelectric properties of $(Bi_{0.25}Sb_{0.75})_2Te_3$ with ceramic addition, Proceedings of the 12.sup.th International Conf. on Thermoelectrics, Nov. 9-11, 2003.
Oku et al., "Formation and photoluminescence of Ge and Si nanoparticles encapsulated in oxide layers," Mater. Sci. Eng. B. 2000, B74, 242-247.
Paine et al., "Visible photoluminescence from nanocrystalline Ge formed by $H_2$ reduction of $Si_{0.6}Ge_{0.4}O_2$," Appl. Phys. Lett. 1993, 62, 2842-2844.
Pan et al., "Nanobelts of Semiconducting Oxides," Science 2001, 291, 1947-1949.
Peng et al., "Mechanisms of the Shape Evolution of CdSe Nanocrystals," J. Am. Chem. Soc. 2001, 123, 1389-1395.
Pileni, "The role of soft colloidal templates in controlling the size and shape of inorganic nanocrystals," Nat. Mater. 2003, 2, 145-150.
Prieto et al., "Electrodeposition of Ordered $Bi_2Te_3$ Nanowire Arrays," Journal of the American Chemical Society, 123, pp. 7160-7161, 2001.
Ren et al., "Synthesis of Large Arrays of Well-Aligned Carbon Nanotubes on Glass," Science 282, pp. 1105-1107, 1998.
Ronggui, Yang et al., "Thermal conductivity modeling of periodic two-dimensional nanocomposites", Physical Review B APS through AIP USA, vol. 69, No. 19, May 15, 2004 (pp. 195316-1, XP002354075.
Routkevitch et al., "Nonlithographic Nano-Wire Arrays: Fabrication, Physics, and Device Applications," IEEE Transactions on Electron Devices, 43, pp. 1646-1658, 1996.
Rowe et al., "Comments on the thermoelectric properties of pressure-sintered $Si_{0.8}Ge_{0.2}$ thermoelectric alloys," Journal of Applied Physics, v. 73, pp. 4683-4685 (1993).
Rowe, D.M., Ed., Handbook of Thermoelectrics, CRC Press, Boca Raton, Florida, 1995.
Saito et al., "Carbon nano-cages created as cubes," Nature 1998, 392, 237-238.
Saloniemi et al., "Electrodeposition of lead selenide thin films," Journal of Materials Chemistry, 8, pp. 651-654, 1998.
Saloniemi et al., "Electrodeposition of PbTe thin films," Thin Solid Films, 326, pp. 78-82, 1998.
Sapp et al., "Template Synthesis of Bismuth Telluride Nanowires," Advanced Materials, 11, pp. 402-404, 1999.
Scoville, et al., "Thermal conductivity reduction in SiGe alloys by the addition of nanophase particles", Nanostructured Materials, NY, NY vol. 5, No. 2, pp. 207-223, Feb. 1995.
She et al., "Impact of Crystal Size and Tunnel Dielectric on Semiconductor Nanocrystal Memory Performance," IEEE Trans. Electron Dev. 2003, 50, 1934-1940.
Song et al., "Thermal conductivity of skutterudite thin films and superlattices," Applied Physics Letters, 77, pp. 3854-3856, 2000.
Springholz et al., "Self-Organized Growth of Three-Dimensional Quantum-Dot Crystals With fcc-Like Stacking and a Tunable Lattice Constant," Science, 282, pp. 734-737, 1998.
Sun et al., "Experimental Study of the Effect of the Quantum Well Structures on the Thermoelectric Figure of Merit in Si/SixGel-x System," Proceedings of Int. Conf. Thermoelectrics, ICT'99, pp. 652-655 (1999).
Sun et al., "Shape-Controlled Synthesis of Gold and Silver Nanoparticles," Science 2002, 298, 2176-2179.
Takahashi et al., "Electrodeposition of PBS Films From Acidic Solution," Journal of Electroanalytical Chemistry, 359, pp. 281-286, 1993.
Taylor et al., "Solution preparation of Ge nanoparticles with chemically tailored surfaces," Mater. Sci. Eng. B 2002, B96, 90-93.
Taylor et al., "Solution Synthesis of Germanium Nanocrystals Demonstrating Quantum Confinement," Chem. Mater. 10, 22-24 (1998).
Taylor et al., "Solutions Synthesis and Characterization of Quantum Confined Ge Nanoparticles," Chem. Mater. 1999, 11, 2493-2500.
Venkatasubramanian et al., "Thin-film thermoelectric devices with high room-temperature figures of merit," Nature, 413, pp. 597-602, 2001.
Venkatasubramanian, "Lattice thermal conductivity reduction and phonon localizationlike behavior in superlattice structures," Physical Review B, 61, pp. 3091-3097, 2000.
Vining, C.B., "Silicon Germanium," in CRC Handbook of Thermoelectrics, ed. Rowe, D.M., CRC Press, Boca Raton, pp. 328-337 (1995).
Wei et al., "Synthesis of Single Crystal Bismuth-Telluride and Lead-Telluride Nanowires for New Thermoelectric Materials," MRS Proc., V. 581, pp. 219-223, 2000.
Wilcoxon et al., "Synthesis and optical properties of colloidal germanium nanocrystals," Phys. Rev. B 2001, 64, 035417-1-035417-9.
Wu et al., "Block-by-Block Growth of Single-Crystalline Si/SiGe Superlattice Nanowires," Nanoletters, 2, pp. 83-86, 2002.
Yang et al., "Genometric Effects on the Transient Cooling of Thermoelectric Coolers," MRS Proc., vol. 691, pp. I G8.27.1-G8.27.6 (2002).
Yang et al., "Measurement of anisotropic thermoelectric properties in superlattices," Applied Physics Letters, 81, pp. 3588-3590 (2002).
Yang et al., "Sol-Gel Preparation and Photoluminescence of Size Controlled Germanium Nanoparticles Embedded in a $SiO_2$ Matrix," J. Phys. Chem B 2003, 107, 13319-13322.
Yang et al., Lattice Dynamics Study of Anisotropic Heat Conduction in Superlattices, Microscale Thermophysical Engineering, vol. 5, pp. 107-116, 2001.
Zhang et al., "Processing and Characterization of Single-Crystalline Ultrafine Bismuth Nanowires," Chemistry of Materials, 11, pp. 1659-1665, 1999.
Zhao, et al., "Bismuth telluride nanotubes and the effects on the thermoelectric properties of nanotube-containing nanocomposites" Applied Physics Letters, AIPR, American Institute of Physics, vol. 86, No. 6, Feb. 3, 2005, p. 62111, XP012066267.
Zhu et al., "Enhancement of photoluminescence in Ge nanoparticles by neighboring amorphous C in composite Ge/C thin films," J. Appl. Phys. 2003, 93, 6029-6033.
Zhu et al., J. Appl. Phys., "Coexisting photoluminescence of Si and Ge nanocrystals in Ge/Si thin film," 90, 5318-5321 (2001).
Japanese Decision to Grant Patent issued Jun. 25, 2013 for Application No. 2009-539534 (3 Pages).
Chinese Office Action dated Aug. 31, 2009 in corresponding patent application 200580044842.6.
Harris, T. et al., "Thermal conductivity reduction of SiGe nanocomposites", Thermoelectric Materials 2003—Research and Applications Symposium Mater. Res. Soc. Symposium Proceedings vol. 793, 2003, pp. 169-174.
Japanese Office Action issued Jul. 24, 2012 for Application No. 2007-539271 (4 Pages).
Korean Office Action dated Feb. 23, 2012 in corresponding patent application No. 10-2007-7012151.
International Preliminary Report on Patentability and Written Opinion for International Application No. PCT/US2007/086291, issued Nov. 24, 2009. (13 pages).
Japanese Office Action issued Dec. 19, 2012 for Application No. 2009-539534 (11 Pages).
Chinese Office Action issued Jul. 17, 2014 for Application No. 201110461268.1 (22 pages).

* cited by examiner

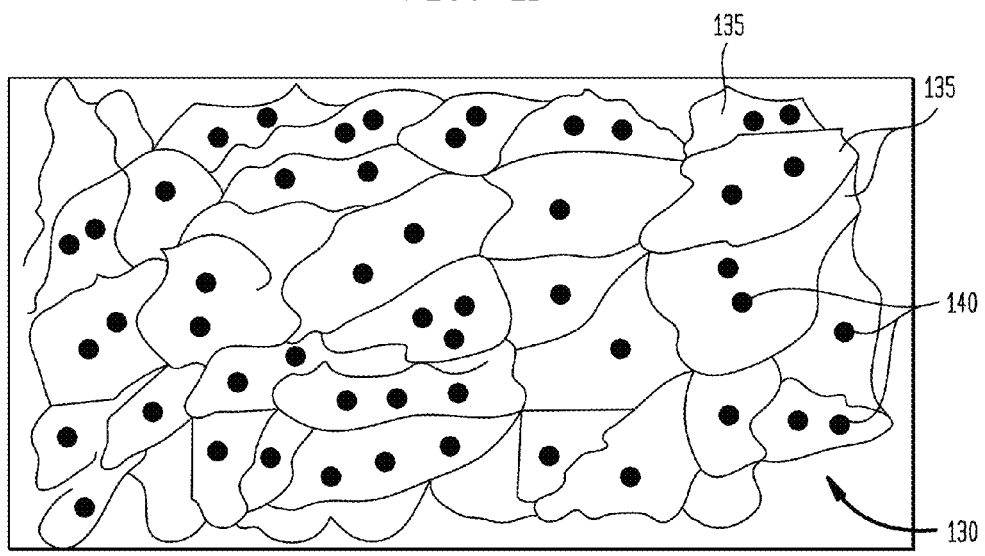
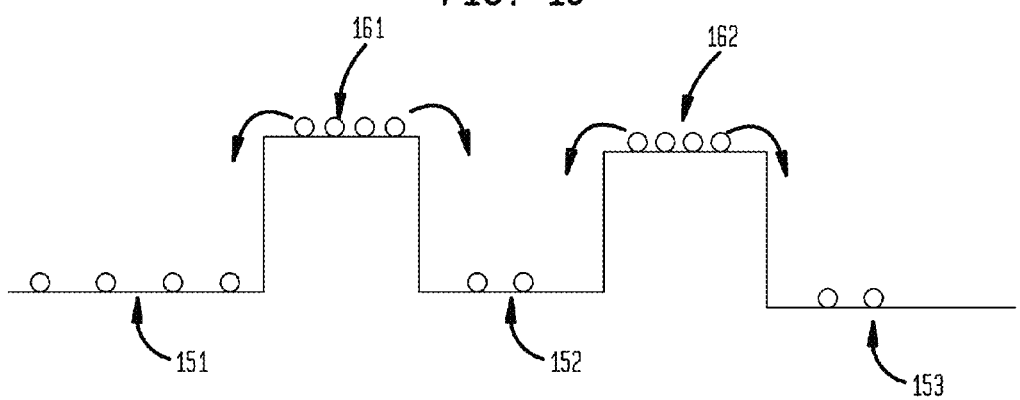

SEEBECK VS. TEMPERATURE

ZT VS. TEMPERATURE

ZT VS. TEMPERATURE

ELECTRICAL CONDUCTIVITY VS. TEMPERATURE

SEEBECK COEFFICIENT VS. TEMPERATURE

THERMAL CONDUCTIVITY VS. TEMPERATURE

ZT VS. TEMPERATURE

ELECTRICAL CONDUCTIVITY VS. TEMPERATURE

SEEBECK COEFFICIENT VS. TEMPERATURE

THERMAL CONDUCTIVITY VS. TEMPERATURE

ZT VS. TEMPERATURE

METHODS FOR HIGH FIGURE-OF-MERIT IN NANOSTRUCTURED THERMOELECTRIC MATERIALS

CROSS REFERENCE TO RELATED APPLICATIONS

The present application is a continuation-in-part of a U.S. patent application bearing Ser. No. 10/977,363, filed Oct. 29, 2004, entitled "Nanocomposites with High Thermoelectric Figures of Merit;" and claims the benefit of a U.S. Provisional Patent Application bearing Ser. No. 60/872,242, filed Dec. 1, 2006, entitled "Methods for High Figure-of-Merit in Nanostructured Thermoelectric Materials." The contents of all these applications are hereby incorporated herein by reference in their entirety.

FEDERALLY SPONSORED RESEARCH

This invention was made with government support under Grant No. NSF0506830 awarded by the National Science Foundation. The government has certain rights in this invention.

FIELD OF THE APPLICATION

The present application relates generally to thermoelectric materials and methods for their fabrication, and more particularly, to such thermoelectric materials that exhibit enhanced thermoelectric properties.

BACKGROUND

The thermoelectric properties of any material can be characterized by a quantity called figure of merit Z (or dimensionless figure of merit ZT), defined as $Z=S^2\sigma/k$, where S is Seebeck coefficient, $\sigma$ is electrical conductivity, and k is total thermal conductivity. It is desirable to construct materials with high ZT values (e.g., having low thermal conductivity k and/or high power factor $S^2\sigma$). By way of example, such materials can potentially be used to construct high quality power generation devices and cooling devices.

SUMMARY

In one aspect, the invention is directed to a method of fabricating a thermoelectric material by generating a plurality of nanoparticles from a starting material such as a thermoelectric bulk material, and consolidating those nanoparticles under pressure at an elevated temperature to form a thermoelectric material that exhibits a higher ZT value than the thermoelectric starting material, e.g., at a temperature below about 2000° C., below about 1000° C., below about 600° C., below about 200° C., or below about 20° C. In some instances the peak ZT value of the formed material can be about 25% to about 1000% greater than the peak ZT value of the starting material. In other instances, the peak ZT of the formed material can be substantially higher than 1000% of the peak ZT of the starting material.

The term "nanoparticle" is generally known in the art, and it is used herein to refer to a material particle having a size (e.g., an average or a maximum size) less than about 1 micron such as in a range from about 1 nm to about 1000 nm. Preferably the size can be less than about 500 nanometers (nm), preferably in a range of about 1 to about 200 nm, and more preferably in a range of about 1 to about 100 nm. The nanoparticles can be generated, for instance, by breaking up a starting material into nano-sized pieces (e.g., grinding using any of dry milling, wet milling, or other suitable techniques). In one example, ball milling can be used to achieve the desired nanoparticles. Optionally, cooling can also be employed while generating nanoparticles (e.g., cooling a starting material while grinding it), so as to further reduce the size of the particles. Some other methods of generating the nanoparticles can include condensation from a gas phase, wet chemical methods, and other methods of forming nanoparticles. In some cases, nanoparticles of different elemental materials (e.g., bismuth or tellurium) can be generated separately, and subsequently consolidated into a resultant thermoelectric material, as discussed further below.

The nanoparticles can be consolidated under a selected temperature and selected pressure so as to induce electrical coupling between the nanoparticles sufficient to form the resultant thermoelectric material. By way of examples, hot pressing including current induced hot presss, unidirectional hot press, plasma pressure compaction ($P^2C$) or spark plasma sintering (SPS), and isostatic hot press processes can be used to achieve the consolidation of the nanoparticles. The selected pressure can be, for example, in a range of about 10 MPa to about 900 MPa, or in a range of about 40 MPa to about 300 MPa, and preferably in a range of about 60 MPa to about 200 MPa. The selected temperature can be, for example, in a range between about 200° C. to about the melting point of the thermoelectric material (e.g., 200° C. to about 2000° C.), or in a range of about 400° C. to about 1200° C., or in a range of about 400° C. to about 600° C., or in a range of about 400° C. to about 550° C. in the case of $Bi_2Te_3$ based materials.

In a related aspect, in the above method, consolidating the nanoparticles refers to compactifying the nanoparticles so as to provide a material exhibiting a density in a range of about 90% to about 100% of the respective theoretical density (e.g., a porosity less than about 10% or less than about 1%).

In a related aspect, a thermoelectric material generated by the methods of the invention, such as those discussed above, exhibits a ZT value (e.g., a peak ZT value) greater than about 1, or greater than about 1.2, or greater than about 1.4, and preferably greater than about 1.5, and most preferably greater than about 2. Further, in many embodiments, the thermoelectric materials exhibit high ZT values at certain operating temperatures, which can depend, e.g., on the materials' melting point, e.g., at a temperature below about 300° C. for $Bi_2Te_3$-based materials. The elevated ZT values can also depend on the doping levels and/or the material's microstructure In many cases, the starting thermoelectric material (e.g., a starting bulk material, or a fluid phase material for synthesizing particles) exhibits a ZT value less than about 1, and optionally greater than about 0.1, and the final thermoelectric material, obtained by generating nanoparticles from the starting material (e.g., breaking up the starting material by grinding or other suitable technique) and consolidating those nanoparticles, exhibits a ZT value greater than about 1, 1.1, 1.2, 1.3, 1.4, 1.5, or 2.

A variety of thermoelectric materials can be used as the starting material in the practice of the invention. The starting thermoelectric material can be p-doped or n-doped. Exemplary starting thermoelectric materials include, without limitation, bismuth-based, lead-based, or silicon-based materials. For example, the starting thermoelectric material can comprise a bismuth-antimony-tellurium alloy, a bismuth-selenium-tellurium alloy, a lead-tellurium alloy, a lead-selenium alloy, or a silicon-germanium (e.g., SiGe) alloy. By way of example, in some embodiments, the thermoelectric material can be $Bi_2Te_{3-x}Se_x$ alloy, wherein x is in a range of about 0 to about 0.8. Alternatively, in some other embodiments, the thermoelectric material can be $Bi_xSb_{2-x}Te_3$ alloy, wherein x is in a range of about 0 to about 0.8. In some embodiments, starting thermoelectric materials can be used that have a polycrystalline structure, which can optionally include an average crystalline grain size (e.g., greater than about 1 micron).

In another aspect, nanoparticles can be generated from a starting thermoelectric material such that the generated nanoparticles have sizes (e.g., average or maximum sizes) less than about 1000 nm, or less than about 500 nm, or less than about 200 nm, and preferably less than about 100 nm, e.g., in a range of about 1 nm to about 200 nm, or in a range of about 1 nm to about 100 nm, and preferably in a range of about 1 nm to about 50 nm. Such particle sizes can be generated by any of the techniques discussed herein, such as grinding a starting material by ball milling, or other suitable techniques.

In a related aspect, in the above method, the nanoparticles are held at the elevated temperature under pressure for a time period, e.g., in a range of about 1 second to about 10 hours, so as to generate a resultant thermoelectric material with enhanced thermoelectric properties. In other aspects, the nanoparticles are subjected to a selected temperature while being held at low or ambient pressure for a time sufficient to allow the resultant thermoelectric material to be formed. In another aspect, nanoparticles can be consolidated under high pressure at room temperature to form a sample with high theoretical density (e.g., about 100%), and then annealed at high temperature to form the final thermoelectric material.

Another aspect is directed to a method of forming a thermoelectric material that includes generating a plurality of nanoparticles. By way of example, the particles can be generated by grinding one or more bulk elemental materials. For example, the nanoparticles can be generated by grinding at least two different bulk elemental materials such as bismuth and tellurium; bismuth and selenium; antimony and tellurium; antimony and selenium; and silicon and germanium in any workable proportion. In such an instance, at least two types of nanoparticles can be formed. If the different types of particles are generated separately, the particles can be mixed and further grinded (e.g., ball milled) to form mechanically alloyed particles. Alternatively, the various bulk materials can all be grinded simultaneously to form the mechanically alloyed particles. A mixture of the nanoparticles, formed using mechanical alloying or separately generated nanoparticles from elements, compounds, or alloys, can be compactified under pressure and at an elevated temperature to generate a resultant thermoelectric material exhibiting a ZT value greater than about 1. A dopant can optionally be added to the mixture. In other embodiments, the nanoparticles can be compactified with other types of particles such as particles from a source material having a good ZT value (e.g., greater than about 0.5), and/or micron-sized particles (e.g., particles having an average size from about 1 micron to about 10, 50, 100, or 500 microns).

In another aspect, a thermoelectric material is provided that includes a material structure comprising a plurality of inclusions having an average size in a range of about 1 nm to about 500 nm, wherein the structure exhibits a ZT value (e.g., a peak ZT value) greater than about 1, and preferably a ZT value greater than about 1.2, or greater than about 1.5, or even greater than about 2.

In a related aspect, the thermoelectric material can exhibit the above ZT values at a temperature below about 2000° C. or below about 1000° C. or below about 600° C. or below about 200° C. or below about 20° C. Further, the average grain size can be in a range of about 1 to about 500 nm. The structure can be substantially free of grains larger than about 500 nm (e.g., it is substantially free of grains having an average and/or a maximum dimension greater than about 500 nm), or can include some larger size grains (e.g., larger than about 1 µm).

In another aspect, one or more of the grains include one or more precipitation regions or other inclusions therein, where the precipitation region or other inclusion can have, e.g., a size in a range of about 1 to about 50 nm, or in a range of about 1 nm to about 20 nm. A precipitation region can be characterized by a different composition, and/or the same composition but different crystalline direction, and/or different phase relative to the rest of the grain.

In another aspect, the thermoelectric material can have a density in a range of about 90% to about 100% of a respective theoretical density. By way of example, the thermoelectric material can exhibit a porosity less than about 10%, and preferably less than about 1%.

In a related aspect, the thermoelectric material exhibits a polycrystalline structure formed of small crystalline grains (e.g., having average sizes less than about 500 nm, or less than about 200 nm, and preferably in a range of about 1 nm to about 100 nm) randomly oriented relative to one another.

One aspect of the invention is directed to a thermoelectric material, which can include a material structure having a plurality of grains. The grains can have an average size in the range of about 1 micron to about 10 microns, or a range of about 1 micron to about 5 microns, or a range of about 1 micron to about 2 microns. At least some of the grains can include one or more precipitation regions or other types of inclusions. Such regions can have an average size from about 1 nm to about 100 nm, or about 1 nm to about 50 nm. The thermoelectric material can have a ZT value greater than about 1, 1.2, 1.5, or 2. For example, the ZT value can also be in a range from about 1 to about 5. The thermoelectric material can exhibit such ZT values at an operating temperature less than about 2000° C., or less than about 1000° C., or less than about 600° C., or less than about 200° C., or less than about 20° C. The grains can be formed from a variety of materials such as any combination of a bismuth-based alloy, a lead-based alloy, and a silicon-based alloy.

Another aspect of the invention is drawn to a thermoelectric material that includes a host material having a plurality of inclusions or particles dispersed throughout the host. The particles or inclusions can have a size less than a threshold value, e.g., less than about 20 microns. Host materials can include one or more grains, where at least some of the grains have a size (e.g., a maximum size in any dimension and/or an average size) greater than about 1 micron, or less than about 1 micron. In some embodiments, the host materials are not heavily doped as in typical thermoelectric materials because a large portion of charge carriers, e.g., more than 50%, 80%, 90%, and preferably 99% in the host material, are due to the presence of these inclusions. In some embodiments, the particles can be more highly doped than the host material. The thermoelectric material can exhibit a carrier concentration and/or charge carrier mobility greater than a respective carrier concentration and/or charge carrier mobility of the host material in the absence of the particles or inclusions, and consequently a higher power factor ($S^2\sigma$). Also, or alternatively, the thermoelectric material can be characterized by the inclusions having an energy band (e.g., conduction or valence) for the charge carrier type that has a higher energy relative to the associated energy band of the host material for the corresponding charge carrier type. The thermoelectric material can optionally include any number of the properties discussed herein with respect to thermoelectric materials. For example, the thermoelectric material can exhibit a ZT value greater than about 1, 1.1, 1.2, 1.3, 1.4, 1.5, or 2.

BRIEF DESCRIPTION OF THE DRAWINGS

Some embodiments of the present invention can be better understood with reference to the following drawings, which are not necessarily drawn to scale.

FIG. 1B is a schematic diagram of a host material with embedded inclusions therein, consistent with some embodiments of the present invention;

FIG. 1C is a schematic of conduction energy diagram for the material depicted in FIG. 1B;

DETAILED DESCRIPTION

Figure 1A:
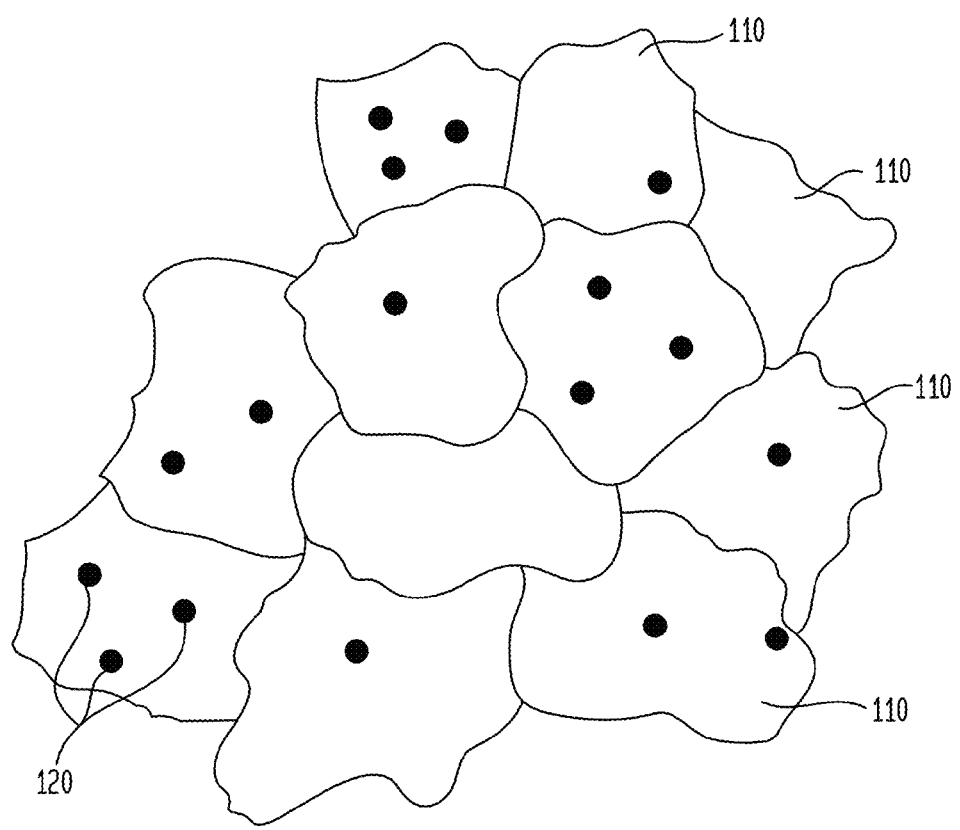
FIG. 1A is a schematic of a plurality of grains in a thermoelectric material, where some of the grains include one or more precipitation regions, consistent with some embodiments of the present invention.

In one aspect, the invention is directed to thermoelectric materials that have high ZT values, and methods of producing such materials. In general, such thermoelectric materials typically comprise a plurality of grains. Such grains can be, e.g., in the form of nano-sized grains that can be obtained from a bulk material such as a starting thermoelectric material. In general, thermoelectric materials consistent with embodiments of the invention can include a variety of sizes of grains. For example, the thermoelectric material can have some grains larger than 1 μm and some grains smaller than 1 μm. In some embodiments, thermoelectric materials can be substantially-free of grains that can adversely affect the ZT value of the material (e.g., being substantially free of adverse grains that can decrease the ZT value of the entire material by more than about 5%, 10%, 15%, 20%, 25%, 30%, 40%, or 50%). Some embodiments are directed to thermoelectric materials with a plurality of grains having an average grain size on the order of microns (e.g., greater than about 1 micron). In some instances, the material can be substantially-free of large grains. Non-limiting examples include being substantially free of grains larger than about 5000 nm, 1000 nm, 300 nm, 100 nm, 50 nm, 20 nm, or 10 nm. In many cases, such grains can optionally include one or more precipitation regions or other types of inclusions having average sizes, e.g., in a range of about 1 nm to about 50 nm. In some preferred embodiments, at least some, and preferably substantially all, of the grains include precipitation regions, nanoparticles, and/or other types of inclusions; these various inclusions can be formed in-situ by chemical reaction and/or by insertion of such inclusions. Further embodiments are directed to a material having a plurality of grain sizes (e.g., at least some nano-sized grains and some grains larger than 1 micron), wherein some of the grains can optionally include precipitation regions or other types of inclusions. In other words, the thermoelectric materials of the invention can include any combination of sub-micron sized grains with or without precipitation regions, grains larger than 1 micron with or without precipitation regions (e.g., using modulation doping), or a mixture of sub-micron grains and grains larger than 1 micron with or without precipitation regions. Any of these grains can be formed by a plurality of mechanisms including, but not limited to, precipitation region formation during material compaction, particle insertion into a host matrix, and/or formation by solid-state chemical reaction.

The ZT value of a thermoelectric material of the invention can take on a variety of values. For example, the peak ZT value, or the average ZT value, of the material can be greater than the peak ZT value, or the average ZT value, of a corresponding starting material from which the thermoelectric material is formed by converting the starting material into nanoparticles and compactifying the nanoparticles under pressure and at an elevated temperature. For example, the ZT value of the material can be about 25% to about 1000% greater than the ZT value of the starting material. In other examples, the ZT value of the material can be substantially greater than 1000% of the ZT value of the starting material. Starting materials can have a range of ZT values. In some embodiments, the ZT values of the formed material can be greater than about 0.8, 0.9, 1, 1.1, 1.2, 1.3, 1.4, 1.5, 1.6, 1.7, 1.8, 1.9, or 2. In some embodiments, the thermoelectric material can exhibit a ZT value in a range whose lower limit is one of the above ZT values and whose upper limit reaches to a value of about 4, 5, or 6.

While these elevated ZT values can be identified without a limitation in temperature, in some embodiments the thermoelectric materials can exhibit the elevated ZT value at a particular temperature or within a temperature range. For example, the thermoelectric material can exhibit an elevated ZT value at a temperature below about 2000° C., below about 1000° C., below about 800° C., below about 600° C., or below about 400° C. In other examples, the thermoelectric material can exhibit an elevated ZT value at a temperature range that begins to approach, or includes, room temperature (e.g., a temperature below about 200° C., below about 150° C., below about 100° C., below about 60° C., below about 40° C., below about 30° C., or below about 20° C.). In still other examples, the thermoelectric material can exhibit an elevated ZT value at a temperature range that approaches, or includes, cryogenic temperatures (e.g., a temperature below about 0° C., below about −50° C., or below about −100° C.); such materials can be useful for particular cooling applications such as air conditioners, refrigerators, or superconductors. In some embodiments, the temperature range in which an elevated ZT value is exhibited can depend upon the composition of a thermoelectric material. In some non-limiting examples, a boron-carbide based composition can exhibit, in some embodiments, an elevated ZT value below about 2000° C., a SiGe based composition can exhibit, in some embodiments, an elevated ZT value below about 1000° C.; a PbTe based composition can exhibit, in some embodiments, an elevated ZT value below about 600° C.; and/or a $Bi_2Te_3$ based composition can exhibit, in some embodiments, an elevated ZT value below about 200° C. In another non-limiting example, the thermoelectric material comprises $Bi_xSb_{1-x}$ and exhibits an elevated ZT below room temperature (e.g., below about 20° C.).

Without necessarily being bound by any particular theory, it is believed that the high ZT values of such thermoelectric materials can be the result of variations in any combination of the thermal conductivity, the Seebeck coefficient, and the electrical conductivity. Thermal conductivity has two contributions: lattice and electron contributions. In single crystals or polycrystalline samples with large grains, lattice thermal conductivity is fixed for a specific material. However, if the bulk material is composed of nanosized grains, and/or nanoparticles embedded in a grain larger than the nanoparticle, we can think of three effects resulting from the nanograins and/or embedded nanoparticles. First, the lattice part of thermal conductivity drops due to interface scattering of phonons. Second, the Seebeck coefficient can increase because of carrier filtering effect (usually low energy electrons/holes are scattered thereby increasing Seebeck coefficient), and third, the electrical conductivity can increase because of a modulation doping effect—the particles serve as a carrier (electron and hole) contributors, and hence reduce impurity scattering in comparison to conventional materials that are homogeneously doped. The electronic contribution to thermal conductivity can potentially be reduced by interfacial barrier scattering of electrons, especially the bi-polar contribution to thermal conductivity since the barrier can preferentially scatter one-type of charge (electrons or holes) without substantially affecting another type of carrier. Additionally, quantum size effects can further affect the Seebeck coefficient and electrical conductivity so that $S^2\sigma$ increases. Accordingly, some embodiments of the present invention can utilize nanoparticles prepared, e.g., by ball milling a starting material, to prepare dense samples (e.g., about 90% to about 100% of theoretical density) by hot press including $P^2C$, unidirectional hot press, isostatic hot press. These hot pressed samples typically show lower thermal conductivity compared to the bulk counterpart, thereby enhancing the ZT value; the power factor is usually maintained or enhanced, though it can also be lowered if the gain in ZT from the drop in thermal conductivity is sufficient.

In some embodiments, a thermoelectric material can comprise grains generated from a bulk starting material, such as a bulk thermoelectric material. Examples include bulk starting materials with a large power factor and/or starting materials with a good ZT value (e.g., a ZT value above about 0.1). For instance, the ZT of the starting material can be greater than about 0.05, 0.1, 0.2, 0.3, 0.4, 0.5, or higher. In some non-limiting instances, the starting material can have a ZT value lower than about 0.8, 0.9, 1, 1.1, 1.2, 1.3, 1.4, 1.5, or 2. In other examples, the starting thermoelectric materials can have a high power factor (e.g., $S^2\sigma$ larger than 20 µW/cm-$K^2$ and preferably larger than 40 µW/cm-$K^2$) but a large thermal conductivity (e.g., larger than 2 W/mK). Such bulk thermoelectric materials can be specifically prepared, or commercially available materials can be utilized. Though many bulk starting materials are solids that can be broken apart to generate grains, bulk starting materials can also be generated from other thermodynamic states such as gases, when generating grains from gas phase condensation, or liquids, when generating grains from wet chemical methods. It is also understood that the grains can be generated from more than one type of bulk starting material, or a mixture of materials having different thermodynamic phases (e.g., a mixture of liquid and gas).

Though any number of starting materials can be utilized, in some embodiments the bulk starting material can be chosen from any combination of a bismuth-based material, a lead-based material, and/or a silicon-based material. In some embodiments, the bulk starting materials can be derived from various alloys such as bismuth-antimony-tellurium alloys, bismuth-selenium-tellurium alloys, bismuth-antimony-tellurium-selenium alloys, lead-tellurium alloys, lead-selenium alloys, silicon-germanium alloys, or any combination thereof. Particular embodiments can be drawn to using bulk starting materials that are either p-type or n-type materials. For example, such starting materials can be compositionally modified forms of a parent composition such as $Bi_2Te_3$. By way of example, n-type materials can be obtained by substituting tellurium in $Bi_2Te_3$ with selenium such that the stoichiometry of the bulk material has a formula $Bi_2Te_{3-x}Se_x$, where x is in a range of about 0 to about 0.8. For p-type materials, antimony can be, for example, used to replace bismuth such that the stoichiometry of the bulk material has a formula $Bi_xSb_{2-x}Te_3$, where x is in a range of about 0 to about 0.8. In a particular embodiment, the bulk starting material utilized is $Bi_{0.5}Sb_{1.5}Te_3$. In general, the bulk starting materials can be a crystalline material or a polycrystalline material (e.g., polycrystalline with an average crystal grain size greater than about a micron). Other examples of starting materials include $MgSi_2$, InSb, GaAs $CoSb_3$, $Zn_4Sb_3$, etc. In some instances, the bulk starting material can be a material with a threshold power factor value, $S^2\sigma$, e.g., larger than about 20 µV/cm $K^2$. In such instances, the bulk starting material can have a reasonable ZT value (e.g., greater than about 0.1) due to the bulk starting material's low thermal conductivity, or the power factor can be at or above a threshold value but the ZT value of the starting material can be low because of the material's relatively high thermal conductivity.

In some embodiments, particles (e.g., nanoparticles) of a thermoelectric material can be generated from a bulk starting material, or elemental materials, by methods beyond grinding/milling one or more starting materials. Particles can be generated by a number of methods, including those methodologies known to the skilled artisan. Non-limiting examples include gas phase condensation, laser ablation, chemical synthesis (e.g., wet or dry methods), rapid cooling of sprays, etc. Accordingly, the scope of the present application is not limited to the specific particle production methodologies discussed herein. It is understood that particle generation techniques can be combined in any fashion to create materials for consolidation. For example, some particles can be generated by ball milling (e.g., to create a host material), while other particles can be generated by one or more other techniques (e.g., gas phase condensation, laser ablation, etc.).

Grains that form a thermoelectric material can have a variety of characteristics. In some embodiments, each grain has a crystalline structure. In such an instance, the thermoelectric material can comprise a polycrystalline-like structure in which the grains generally lack a preferred orientation (e.g., randomly distributed). In some instances, the grains can also exhibit some type of preferred orientation due to grain shapes, where the general crystalline direction of the grains can either be random or exhibit some preferred direction relative to one another. Accordingly, such embodiments differ substantially from many known thermoelectric materials that exhibit an average crystalline structure (including superlattice structures formed, e.g., as a stack of a plurality of semiconducting layers), albeit with small defect or compositional inhomogeneities in the average crystalline structure.

Grains of which the various thermoelectric materials discussed herein are composed can have a variety of sizes. In some embodiments, the sizes are generally nanometer-scale, and generally smaller than a micron. For example, the grains can have an average grain size less than about 500 nm, or less than about 200 nm, or less than about 100 nm, or less than about 50 nm, or less than about 20 nm. In such embodiments, the average grain size can be greater than some lower threshold value (e.g., about 1 nm). In some cases, the average grain size can be determined using a variety of methodologies, including methods understood by those skilled in the art. For example, transmission electron micrographs (herein "TEMs") can be used to image the grains whose sizes can then be determined and averaged. Since grains are typically irregularly shaped, the measured size of a grain can be determined using any number of techniques, including ones known to the skilled artisan. For example, the largest dimension of the grain can be used from an image (e.g., a SEM and/or TEM image), or an effective diameter can be calculated based on surface area measurements or the effective-cross sectional area of grains from an image.

In many embodiments of the invention, the grains of a thermoelectric material can be compacted such that the end-product exhibits desired properties such as an elevated ZT value. In some embodiments, the thermoelectric material comprises compacted grains in a structure that exhibits a low porosity (e.g., the actual density of the end-product can approach the theoretical density of the composition, for instance a bulk starting material used to make nanoparticles in some embodiments), which can aid in obtaining an elevated ZT value. Porosity is defined as the difference between the theoretical density and the actual density of the material divided by the theoretical density. In general, the phrase "theoretical density" is known to those skilled in the art. The porosity in the material can be less than about 10%, 5%, or 4%, or 3%, or 2%, or 1%, or 0.5%, or 0.1%. In some embodiments, a thermoelectric material exhibits a density approaching 100% of a theoretical density. In some embodiments, the density of a thermoelectric material can be between 100% and 90%, 95%, 96%, 97%, 98%, 99%, 99.5%, or 99.9% of a respective theoretical density. Without necessarily being bound by theory, it is believed that densification can help maintain contact between grains, which can help maintain the electrical conductivity of the material.

Some embodiments are directed to a thermoelectric material formed from a plurality of grains, in which one or more of the grains can include one or more precipitation regions. By way of example, FIG. 1 schematically depicts such a thermoelectric material that exhibits a polycrystalline structure including a plurality of grains 110. The grains can further include one or more precipitation regions 120, which can enhance the thermoelectric properties of the material. A precipitation region can be characterized by a compositional inhomogeneity such as having a different composition and/or phase than the rest of the grain. A precipitation region can also be characterized as having a similar crystalline structure to the matrix in which it is embedded, though oriented in a different crystalline direction. In some embodiments, one or more precipitation regions can be embodied as a discrete particle (e.g., a nanoparticle) embedded in a grain, or the whole grain can be embodied as a crystal, albeit with defects due to the presence of a precipitation region. In some embodiments, the thermoelectric material can include other grains that do not have precipitation regions. In an alternative embodiment, substantially all of the grains that comprise a thermoelectric material include precipitation regions. The precipitation regions typically have sizes (e.g., maximum average size) less than about 10 nm, or less than about 50 nm (e.g., in a range of about 1 nm to about 50 nm). Formation of precipitation regions can be achieved in a variety of manners including the techniques discussed in U.S. Patent Application Publication No. US 2006/0102224, bearing Ser. No. 10/977,363, filed Oct. 29, 2004, entitled "Nanocomposites with High Thermoelectric Figures of Merit," which is incorporated herein by reference in its entirety.

In some cases, the precipitation regions are generated spontaneously through the formation of the thermoelectric material, e.g., via the methods discussed herein. In other cases, the precipitation regions are generated by mixing two types of nanoparticles having different melting temperatures. For example, one type can have a lower melting point than the other. By mixing the nanoparticles and heating/consolidating them (e.g., at a temperature close to the melting point of one type of the nanoparticles but below the melting point of the other type), the nanoparticles having the lower melting temperature can form grains around the other type of nanoparticles. In other words, grains formed of one type of the nanoparticles can embed the nanoparticles of the other type Examples of ensemble materials that can be used to form such embedded nanoparticles include bismuth-telluride material systems, lead-telluride material systems, silicon-germanium material systems, etc.

It should be understood that though the aforementioned discussion is explicitly directed to precipitate formation in thermoelectric materials, other materials are formed by utilizing other types of inclusions into a matrix (e.g., use of nanoparticles in a host). For example, two or more types of nanoparticles can be mixed together to form a thermoelectric material may not include precipitates but can still have advantageous properties (e.g., use of modulation doping). Accordingly, the disclosure herein regarding precipitates can also be utilized with respect to other types of inclusions where appropriate. For example, the precipitation or inclusion regions can be formed via solid-state chemical reaction of a particle with the host, such as Mo, Fe, Mn, Mg, Ag, Cr, W, Ta, Ti, Cu, Ni, or V metallic particle reacting with Si in a SiGe host to form $MoSi_2$, $FeSi_2$, $MgSi_2$, etc. particles.

Without being limited to any particular theory, it is believed that the precipitation regions or other types of inclusions can enhance phonon scattering in a thermoelectric material, which can lead to lowering of the thermal conductivity of the material. In addition, n-doped or p-doped regions can enhance electrical conductivity of the material, e.g., via a modulation-doping mechanism. In such an instance, some or all of the charge carriers (electrons and holes) can be donated by precipitation regions or other inclusions embedded in larger grains. Because the distance between inclusion regions can be larger than the distance between atomic dopants in a homogeneously doped material, the impurity scattering of the charge carriers is reduced compared to that in homogeneously doped materials. Such a modulation-doping like mechanism can increase the electrical conductivity through improving carrier mobility. In some instances, these precipitation regions or other inclusions can also improve the Seebeck coefficient by scattering low energy carriers more than higher energy ones. As such, the precipitation regions or other inclusions can improve the ZT of the thermoelectric material.

In other embodiments, precipitation regions, or grain regions or other inclusions, may be preferentially doped. In such circumstances, the carriers of these regions can fall into the surrounding host medium when they are at a higher potential energy. For example, in the case of modulation doping, doping in the host material can be correspondingly reduced or completely eliminated, thus enhancing the electron mobility in the host by reducing ionized impurity scattering.

Embodiments that include precipitation regions or other inclusions in grains can exhibit any number of grain sizes. In some embodiments, the grain sizes are consistent with any of the sizes described herein for grains that are generally smaller than a micron. For example, the average grain size can be less than about 500 nm, about 200 nm, about 100 nm, about 50 nm, or about 20 nm. Alternatively or in addition, the average grain size can be greater than about 1 nm. In other embodiments with one or more inclusions, the grain sizes can be larger than a micron. For example, a plurality of grains can have average sizes up to about 2 microns, 5 microns, or 10 microns. In particular embodiments, the plurality of grains have an average size in a range of about 1 micron to about 10 microns, or in a range of about 1 micron to about 5 microns, or in a range of about 1 micron to about 2 microns.

The size of the precipitation regions or inclusions can also vary. For example, the size of the precipitation region can be bound by the size of the grain in which it is embedded. In many embodiments, a precipitation region or inclusion can preferably have an average size in a range of about 1 nm to about 50 nm, or a range from about 1 nm to about 20 nm. In other instances, for example when a modulation doping mechanism is used to increase the electron performance, the precipitation region or inclusion can have a larger size, e.g., from 1 nm to 10 microns, while the phonon thermal conductivity reduction in the surrounding region is achieved by alloying or nanograining.

Some embodiments are directed to manufactured thermoelectric materials that exhibit modulation doping to achieve enhanced figures of merit. In some embodiments, a thermoelectric material can include particles (e.g., nanoparticles) or other inclusions embedded in a host material, where the inclusions donate charge carriers (e.g., electrons or holes) to the host, thereby increasing the carrier mobility in the host. This can advantageously enhance the electrical conductivity of the entire material, and hence improve its thermoelectric performance, e.g., characterized by the material's ZT value. In many such cases, the host is selected to be initially undoped or to have an n-type or p-type doping level (typically a doping level that is spatially substantially uniform) that is less than typical doping values for thermoelectric materials. For example, the initial doping level of the host can be a factor of 1.5, 2, 5, 10, 100, or 1000 less than a conventional thermoelectric material. Further, the embedded inclusions (e.g., precipitation sites or distinct particles) can be formed of doped or undoped materials.

By way of example, FIG. 1B schematically depicts such a thermoelectric material that includes a host 130 in which a plurality of particles 140 are embedded—the particles acting as inclusions. In this case, the host includes a plurality of grains 135, e.g., a plurality of crystalline grains, which have in some cases sizes (e.g., maximum grain size in any dimension) less than about 1 micron, e.g., in a range of about 500 nm to less than about 1 micron. In other cases, the grain sizes can be larger, e.g., in a range of about 1 micron to about 20 microns. Further, while in some cases the particles can have sizes (e.g., a maximum size in any direction) less than about 1 micron, e.g., in a range of about 1 nm to about 200 nm or in a range of about 2 nm to about 100 nm, in other cases the particle sizes can be greater than 1 micron, e.g., in a range of about 1 micron to about 10 microns. The inclusions 140 can be formed in a variety of ways. For example, they can be formed as precipitation regions using any appropriate technique including those discussed with respect to other embodiments herein. In other cases, they can be formed of a material different than that of the host by utilizing, e.g., the techniques discussed in the above-referenced patent application entitled "Nanocomposites with High Thermoelectric Figures of Merit." In yet other cases, the particles can be formed via solid-state chemical reaction, e.g., during a consolidation phase.

Without loss of generality, in this example, the host 130 is assumed to be a SiGe alloy having a plurality of micron-sizes and/or nanosized grains 135, and the particles 140 can be $MoSi_2$ (molybdenum silicide) particles that are embedded in the SiGe alloy. Such a thermoelectrical material can be formed, e.g., in the following way: adding molybdenum to SiGe, melting the material, and cooling the material (e.g., in a manner discussed above) to make ingots, which can be grinded and compacted if needed. In this approach, the $MoSi_2$ particles are formed via a solid-state chemical reaction of Mo with Si, e.g., during the cooling process. In this example, the SiGe host is not heavily doped although in other cases it can be, e.g., it can be doped p-type, but less than in a conventional SiGe thermoelectric materials by a factor of 2, 5, 10, or 100. Additionally, holes can be generated by the presence of $MoSi_2$. Such donation of the holes to the host can enhance the hole mobility within the material and hence improve the electrical conduction and consequently thermoelectric performance of the material. In other instances, the particles can be formed via solid-state chemical reaction of a Si in a host (e.g., SiGe) by grinding Si and Ge elements or SiGe crystalline alloy with Fe, Mn, Mg, Cr, W, Ta, Ti, Cu, Ni, or V to form $FeSi_2$, $MgSi_2$, etc. particles, or grinding the respective silicides with the Si and Ge or SiGe alloy together. Some of them may be applicable to n-type while others to p-type materials. Other nanoparticles (e.g., metallic and/or semiconductor nanoparticles) that do not react with Si can also be used to create modulation doping such as Ag as inclusions.

For further illustration of such donation of charge carriers from the particles to the host, without being limited to any particular theory, FIG. 1C schematically depicts a charge carrier energy diagram corresponding to a hypothetical thermoelectric material (e.g., the above SiGe-based material having $MoSi_2$ particles embedded therein) representing portions 151, 152, 153 corresponding to the host material and portions 161, 162 corresponding to a particle embedded in the host. It is understood that the diagram is schematic and presented only for illustrative purposes. Charge carriers (e.g., electrons or holes) in a energy band of the particles 161, 162 (e.g., a conduction or valence band) can have higher energy than those in an energy band of the host 151, 152, 153, which can be the conduction or valence band. Accordingly, a plurality of charge carriers in the particles, which can be either due to additional doping in the particle or due to its intrinsic large density of electrons (as in metals or semimetals), can move to the host to lower their energies. This transfer of charge carriers from the particles to the host can advantageously increase carrier mobility, e.g., by reducing dopant in the host material and hence reducing the ionized impurity scattering. In this manner, a higher electrical conduction can be achieved. In some cases, even though an overall higher electron mobility is not achieved, because grain boundaries still scatter electrons, this modulation doping method can still beneficial by compensating for the reduction in mobility due to electron grain boundary scattering. The particles used for modulation doping can also potentially lead to higher Seebeck coefficient as they can scatter low energy carriers, and reducing thermal conductivity of both phonons and electrons. In some other cases, rather than donating electrons to the host, the particles can donate holes to the host. Again, without being limited to any particular theory, the mechanism of such donation of charge carriers from the particles to the host can be based on some holes moving from higher energy levels in the valence band of the particles to lower energy levels in the valence band of the host, or by attracting electrons in the valence band of the host into the particles, creating more holes in the host, or attracting electrons in the valence band of the host into the particles, creating more holes in the host.

In general, the types of starting materials, the temperatures at which an elevated ZT is measured, the grain constituents, the formation methods, and other properties and processes that can be associated with these embodiments include all the traits and methods discussed within the present application, which are consistent with the grain sizes, precipitation regions, and/or other inclusions described. For example, the grains can be formed of any suitable thermoelectric material, such as those discussed above, and can further include n-type or p-type dopants. In another example, the formed thermoelectric material has a ZT value greater than about 1.0, greater than about 1.5, greater than about 2, or in a range from about 1 to about 5. In yet another example, the formed thermoelectric material has a ZT value (e.g., elevated relative to a starting material) at an operating temperature below about 2000° C., below about 1000° C., below about 600° C., below about 200° C., or below about 20° C. In another example, the grains of the thermoelectric material can include at least one of a bismuth-based material (e.g., $Bi_2Te_3$ and/or its associated alloys), a silicon-based material, and a lead-based material. With regard to producing such materials, the methods of forming nanoparticles from bulk starting materials, or elemental materials, can be applied as discussed herein, albeit by adjusting parameters such as grinding speeds, duration, and/or temperature (including cryogenic) to obtain the desired nanoparticle sizes for compaction. Further, such adjustment of the nanoparticle sizes can be employed to obtain desired grain sizes in the final thermoelectric material (e.g., less than 1 micron, or greater than 1 micron but less than 10 microns). The compaction methods can also be applied as discussed herein, and as applied by one skilled in the art.

Other embodiments of the present application are directed toward methods of fabricating a thermoelectric material. In such a method, a plurality of nanoparticles is generated from a thermoelectric material. The nanoparticles can be consolidated under pressure at an elevated temperature to form the thermoelectric material. The types of thermoelectric starting materials that can be utilized to generate the nanoparticles include, without limitation, any of the bulk materials disclosed herein, and others known to those skilled in the art. Accordingly, embodiments can include thermoelectric materials having a ZT value greater than about 1 (e.g., at a temperature below about 2000° C.). In addition or alternatively, the methods can utilize starting materials (e.g., bulk thermoelectrics which are elemental and/or alloys) that are n-doped or p-doped.

A variety of techniques can be utilized to generate the nanoparticles from a thermoelectric material. In some embodiments, the nanoparticles are produced by grinding the thermoelectric material. Grinding can be performed using a mill, such as a ball mill using planetary motion, a figure-eight-like motion, or any other motion. When generating nanoparticles, some techniques, such as some grinding techniques, produce substantial heat, which may affect the nanoparticle sizes and properties (e.g., resulting in particle agglomeration). Thus, in some embodiments, cooling of a thermoelectric material can be performed while grinding the material. Such cooling may make a thermoelectric material more brittle, and ease the creation of nanoparticles. Cooling and particle generation can be achieved by wet milling and/or cryomilling (e.g., in the presence of dry-ice or liquid nitrogen surrounding the mill). Embodiments of the invention can also utilize other methods for forming nanoparticles. Such methods can include gas-phase condensation, wet chemical methods, spinning molten materials at high speed, and other suitable techniques.

Consolidation of the nanoparticles under pressure and elevated temperature can be performed in a variety of manners, under a variety of conditions. Processes such as hot press can be employed to impose the desired pressure and temperature during consolidation. A description of this process, and an apparatus for carrying out this process, is available in U.S. Patent Application Publication No. US 2006/0102224, bearing Ser. No. 10/977,363, filed Oct. 29, 2004; which is incorporated by reference in its entirety herein.

The pressures utilized are typically super-atmospheric, which allow for the use of lower temperatures to achieve consolidation of the nanoparticles. In general, the pressures utilized can range from about 10 MPa to about 900 MPa. In some embodiments, the pressure ranges from about 40 MPa to about 300 MPa. In other embodiments, the pressure ranges from about 60 MPa to about 200 MPa.

With respect to the elevated temperature, a range of temperatures can be utilized. In general, the temperature typically ranges from about 200° C. to about the melting point of the thermoelectric material. In some exemplary embodiments, the temperature is in a range from about 400° C. to about 2000° C., from about 400° C. to about 1200° C., from about 400° C. to about 600° C., from about 400° C. to about 550° C. For some exemplary n-doped materials, the temperature is in a range from about 450° C. to about 550° C., while for some exemplary p-doped materials the range is a few degree higher (e.g., in a range of about 475° C. to about 580° C.). Other temperature ranges can also be utilized in connection with processing n and p-type materials. These particular pressure and temperature ranges can be utilized with any material, though they can preferably be applied to materials such as BiSbTe alloys and BiSeTe alloys.

The pressures and temperatures can be maintained for a time sufficient to allow consolidation of the nanoparticles. In some embodiments, the time is in the range from about 1 sec to about 10 hours.

Other consolidation techniques can also be utilized to form the thermoelectric materials described in the present application. For example, nanoparticles can be impacted at high speed against other particles to achieve low temperature compaction. Subsequent heat treatment can optionally be utilized to form the thermoelectric material. Other consolidation processes can utilize annealing of particles (e.g., nanoparticles) using little or no pressure to consolidate the particles. In such instances, the temperature can be selected to induce annealing of particles at whatever pressure the sample is held at during annealing. In other instances, particles can be consolidated at high pressure at a relatively low temperature to form a consolidated material, such as a material with close to 100% theoretical density. The consolidated material can be subsequently annealed at an elevated temperature to form the thermoelectric material. Accordingly, consolidation techniques need not be restricted to $P^2C$ or hot pressing methods.

As an exemplary embodiment, nanopowders of various materials from commercial materials can be prepared by high energy ball milling to obtain nanoparticles with particle sizes as small as 1 nm. In some cases, dry milling can be combined with wet milling and/or cryo-milling to inhibit agglomeration of the milled particles into larger size particles due to heat generated during the milling. In this manner, more dispersed particles can be obtained. These powders can be compacted into solid samples by hot press including a $P^2C$ technique. In many embodiments, about 100% density of the theoretical value can be achieved by this method within a short period of time (typically about 1 to about 10 minutes per sample). The lattice thermal conductivity of hot pressed samples prepared by these methods can be reduced to a fraction of the original value in both n- and p-types while maintaining a power factor comparable to the bulk counterpart thereby substantially enhancing the ZT value.

For example, in a p-type commercial material of $Bi_xSb_{2-x}Te_3$, where x can range from about 0 to about 0.8, the commercial material has a highest ZT value about 1 whereas after ball milling and hot pressing, it can be as much as 1.4 or higher. These enhancements are primarily due to reduced thermal conductivity attributed to the presence of nanostructures in the samples.

In some embodiments, rather than converting a thermoelectric starting material into nanoparticles (or using some other particle generation method) and compactifying those nanoparticles, nanoparticles are generated (e.g., by grinding) from at least two elemental materials (e.g., elemental Bi and elemental Te). The nanoparticles are then mixed and compactified under pressure and at elevated temperature (e.g., the pressures and temperatures discussed above) to generate a resultant thermoelectric material (e.g., one having a polycrystalline structure with grains having sizes less than about 500 nm, and preferably in a range of about 1 to about 100 nm) that exhibits a ZT value greater than about 1, and preferably greater than about 1.2, or about 1.5, or about 2.

In an alternative embodiment, two or more bulk materials can be grinded simultaneously to generate a variety of nanoparticles having different compositions. The grinding process can be used to "mechanically alloy" the nanoparticles. Mechanical alloying can also be performed by generating two or more different particles separately, and subsequently mixing the particles together and further grinding them to alloy and decrease the size of the particles to form alloyed nanoparticles. The particles can be consolidated to form a thermoelectric material having one or more of the properties discussed in the present application.

In yet another embodiment, different types of nanoparticles can be separately generated using any of the techniques discussed herein (e.g., grinding bulk elemental materials such as bismuth or tellurium), and then mixed together and consolidated to form a thermoelectric material. Additional grinding of the mixture can optionally be applied before consolidation. The end-consolidated material formed by any of these processes can have any of the composition characteristics described within the present application, e.g., $Bi_2Te_{3-x}Se_x$ where x is in a range of about 0 to about 0.8 such as $Bi_2Te_{2.8}Se_{0.2}$, or $Bi_xSb_{2-x}Te_3$, wherein x is in a range from about 0 to about 0.8 such as $Bi_{0.5}Sb_{1.5}Te_3$.

Other embodiments directed to forming thermoelectric materials utilize one or more repetitions of steps used to form thermoelectrics as discussed herein. For example, particles (e.g., nanoparticles) can be generated from one or more starting materials (e.g., bulk starting thermoelectric materials or elemental materials) and consolidated into a material structure. The resulting structure can then be used to generate a new plurality of particles (e.g., by grinding the material structure), which can be subsequently consolidated to form another material structure. This process can be repeated any number of times to form an end-thermoelectric material. Such a process can aid in generating small grain sizes that are thoroughly mixed.

For some embodiments, it can be advantageous to protect particles that are being generated from oxidation (e.g., during a ball milling process). Non-limiting examples of protection techniques include exposing the generated particles (e.g., the environment in which grinding of a material takes place) to an oxygen-depleted environment such as a relative vacuum or an environment with low oxygen content relative to atmospheric pressure. The generated particles can also be exposed to some type of chemical coating to reduce oxygen exposure to the surface; the coating can be optionally removed later in the thermoelectric material manufacturing process. Accordingly, protection schemes can include any number of adequate techniques, including those known to one skilled in the art.

The following experimental section is provided for further illustration of various aspects of the invention and for illustrating the feasibility of utilizing the methods of the invention for generating thermoelectric materials exhibiting enhanced thermoelectric properties. It should, however, be understood that the following examples are provided only for illustrative purposes and are not necessarily indicative of optimal results achievable by practicing the methods of the invention.

EXPERIMENTAL RESULTS

Example 1

Nanocrystalline Bulk p-Type $Bi_xSb_{2-x}Te_3$ Materials

Commercial materials (p-type BiSbTe alloy ingots) were pulverized and loaded into a zirconia jar inside the glove box in an argon atmosphere to avoid oxidation. A few zirconia balls (5-15 mm size) were also added and sealed. The sealed jar was placed into a ball mill and milled for total of about 0.5 to 50 hours at a speed of 100 to 2000 rpm. The powders were characterized using scanning electron microscope (SEM), transmission electron microscope (TEM), and x-ray diffraction (XRD).

Figure 2:
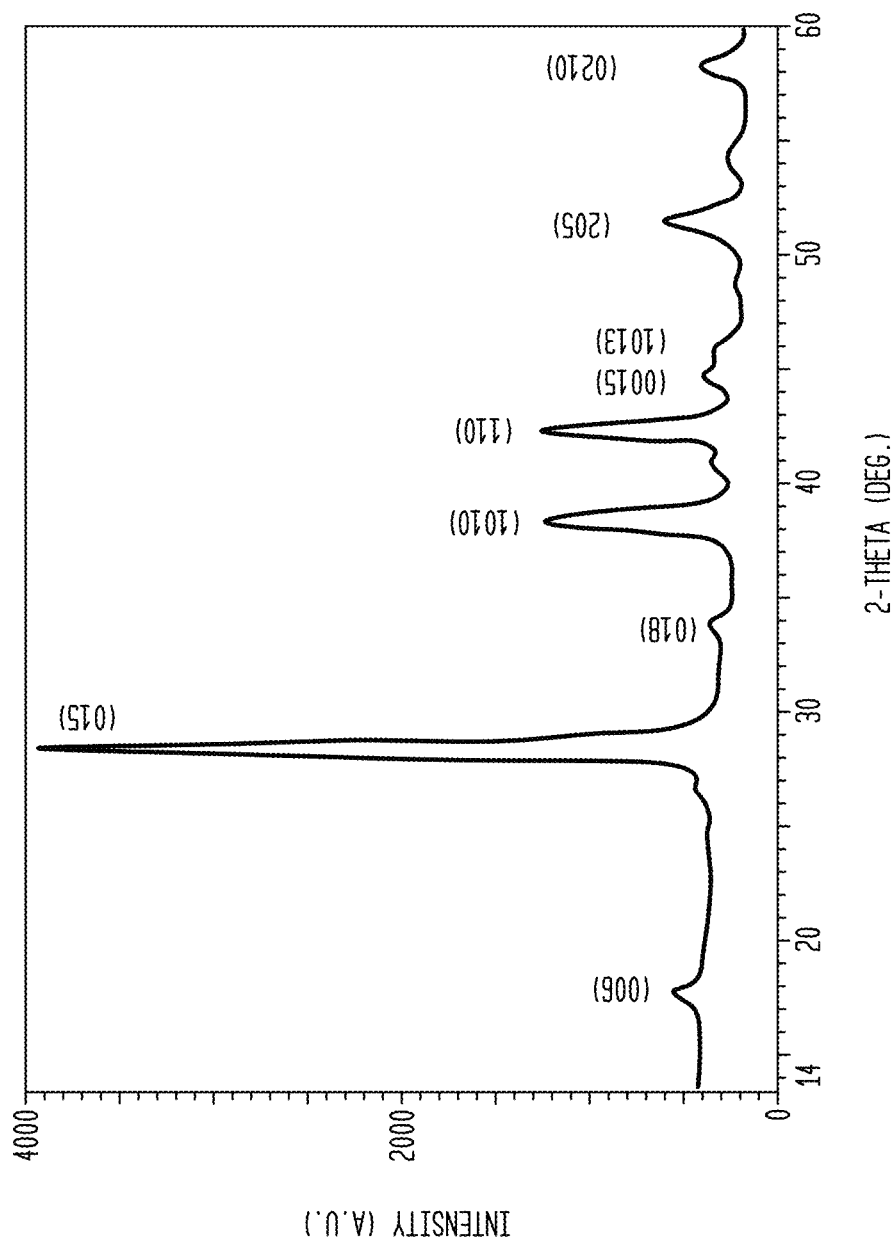
FIG. 2 is an XRD pattern of p-type BiSbTe nanoparticles prepared by ball milling, consistent with some embodiments.
Figure 3A:
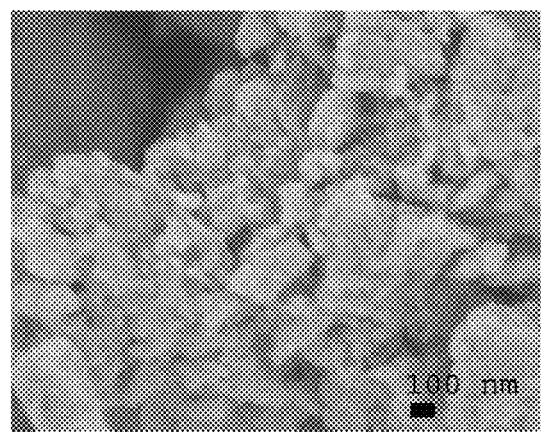
FIG. 3A is a SEM image of the p-type BiSbTe nanoparticles of FIG. 2.
Figure 3B:
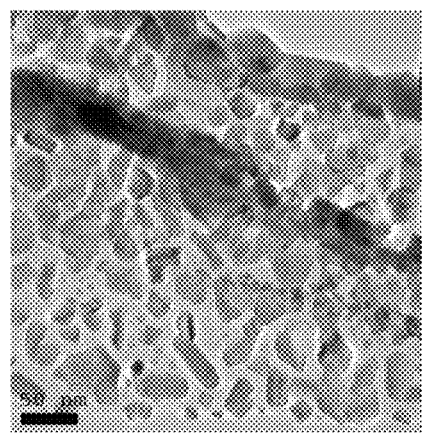
FIG. 3B is a lower resolution TEM micrograph of the BiSbTe nanoparticles of FIG. 2.
Figure 3C:
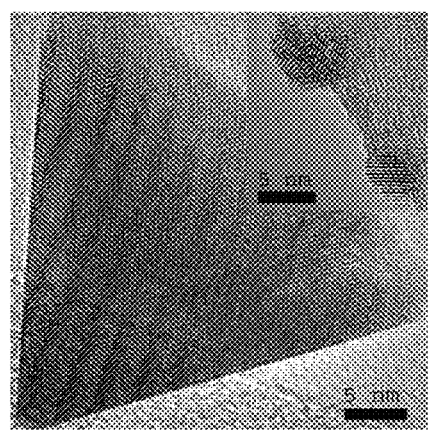
FIG. 3C is a higher resolution TEM micrograph of the BiSbTe nanoparticles shown in FIG. 3B.

FIG. 3 shows the x-ray diffraction (XRD) pattern of the nanopowders after ball milling. The XRD pattern verifies that the powder is a single phase, and is well matched with those of $Bi_{0.5}Sb_{1.5}Te_3$. The broadened diffraction peaks indicates that the particles are small. The small size is confirmed by the scanning electron microscope (SEM) image of the nanopowders depicted in FIG. 2A, and the lower magnification transmission electron microscope (TEM) image of the powder presented in FIG. 2B. The lower resolution TEM image of FIG. 2B clearly shows that the nanoparticles have sizes of a few to about 50 nm, with an average size about 20 nm. The high resolution TEM image presented by FIG. 2C confirmed the good crystallinity of the nanoparticles and the clean particle surfaces, which are desired for good thermoelectric properties. The inset of FIG. 2C also shows that some of the nanoparticles are even smaller than 5 nm.

Figure 4A:
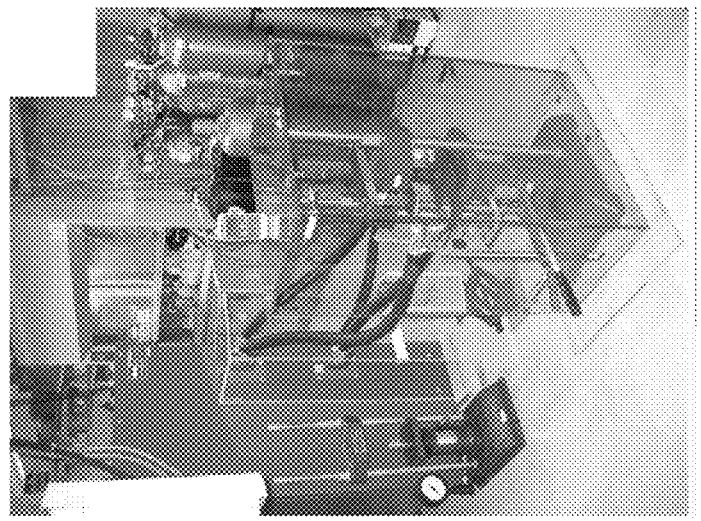
FIG. 4 is a diagram of a DC hot press device which can be utilized with some embodiments of the present invention.
Figure 4B:
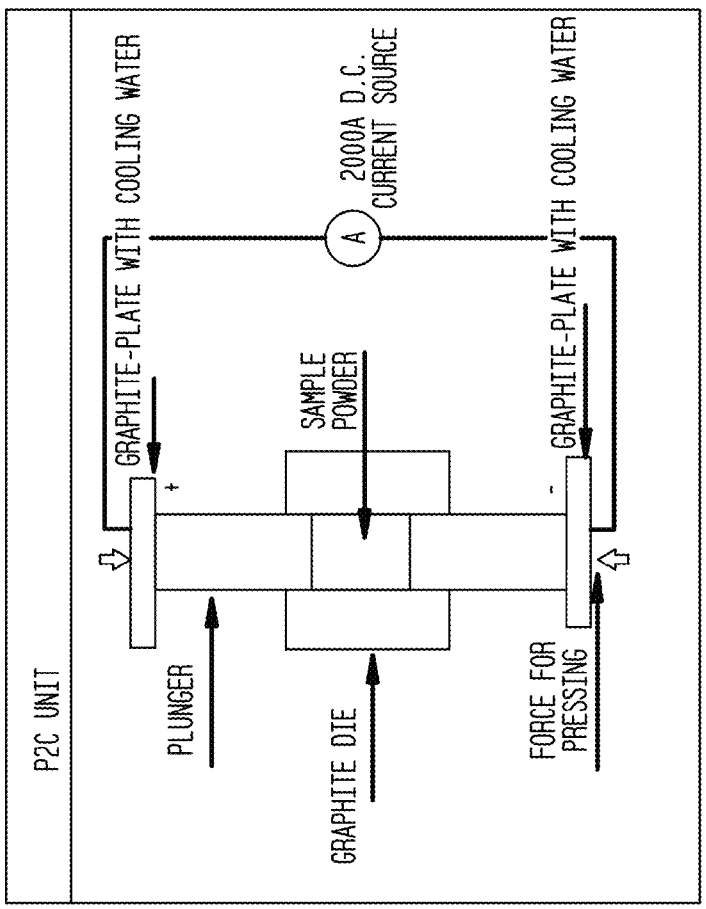

Once the powders were obtained, powder samples were processed into bulk disk samples of ½" in diameter and 2-12 mm thick by hot-pressing of the nanopowders loaded in a ½" diameter die. The powders after milling, which were stored inside the glove box to prevent oxidation, were loaded into a graphite die and pressed into pellets using a DC hot press technique (see FIG. 4). Parameters for the hot pressing conditions are from 40-160 MPa and 450° C.-600° C. The densities are close to 100% of the theoretical value for all the compositions. Disks of ½" diameter and 2 mm thick and bars of about 2×2×12 mm³ were cut and polished from the pressed disks for measurements of the electrical and thermal conductivities and Seebeck coefficient using both DC and AC methods.

Typically in preparing the hot pressed samples, the powder is exposed to the selected pressure and the device is activated at a designated heating rate. Upon reaching a selected elevated temperature, the sample is held at the temperature and pressure for anywhere between about 0 min and to about 60 min, preferably between about 0 min to about 30 min, between about 0 min to about 10 min, or between about 0 min and less than 5 min (e.g., for 2 min.). Then cooling is initiated. It is understood, however, that the pressure can be imposed during or after the sample reaches the elevated temperature.

FIGS. 5-9 compare the temperature dependence of various properties of a hot pressed nanocrystalline material (labeled BP0572) and a commercial material (labeled corn ingot) p-type BiSbTe alloy ingot. All the properties are measured from the same sample in FIGS. 5-9. Cylinder-like thick disks were hot-pressed and cut both along and perpendicular to the press direction and then measured. To test the temperature stability of the nanocrystalline bulk samples, the same samples were repeatedly measured up to 250° C. No significant property degradation was observed.

Figure 5:
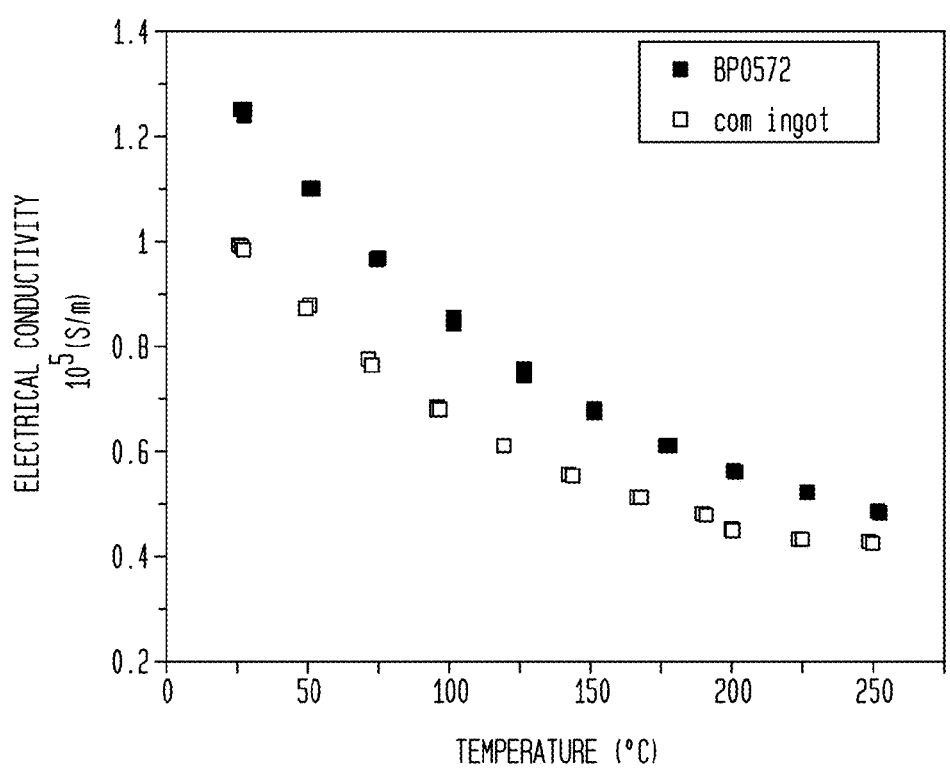
FIG. 5 is a graph depicting the temperature dependence of the electrical conductivity for a thermoelectric material prepared from the particles of FIG. 2 and a state-of-the-art bulk material of p-type BiSbTe alloy, consistent with some embodiments.

FIG. 5 compares the temperature dependence of the electrical conductivity of the nanocrystalline and commercial samples. The electrical conductivity was measured by a four-point current-switching technique. The electrical conductivity of the nanocrystalline bulk sample is slightly higher than that of the commercial ingot.

Figure 6:
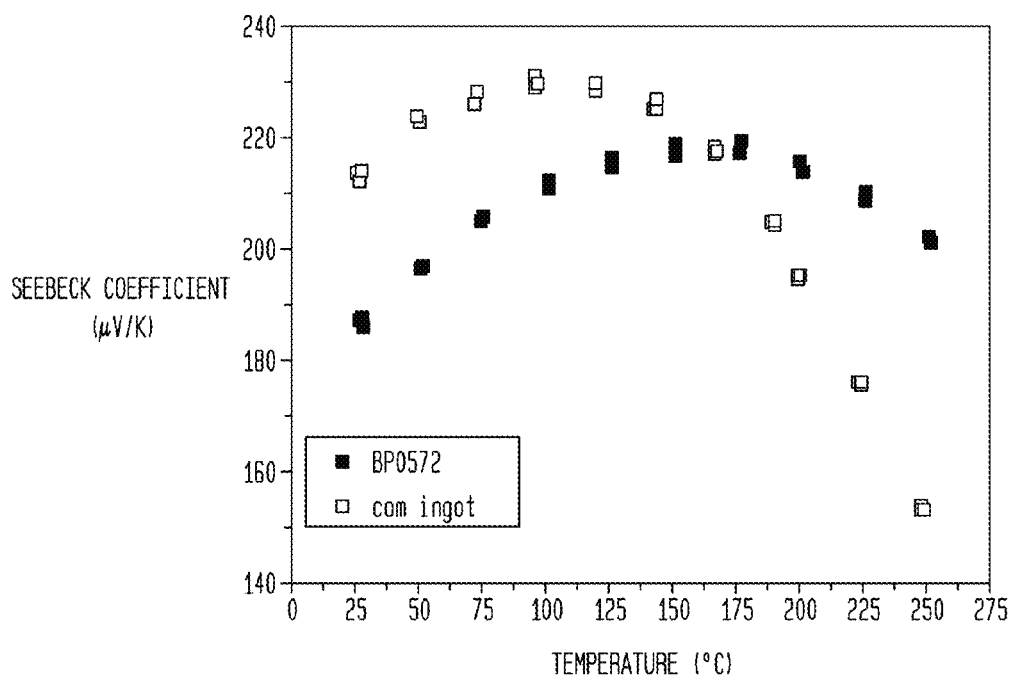
FIG. 6 is a graph depicting the temperature dependence of the Seebeck Coefficient for a thermoelectric material prepared from the particles of FIG. 2 and a state-of-the-art bulk material of p-type BiSbTe alloy, consistent with some embodiments.
Figure 7:
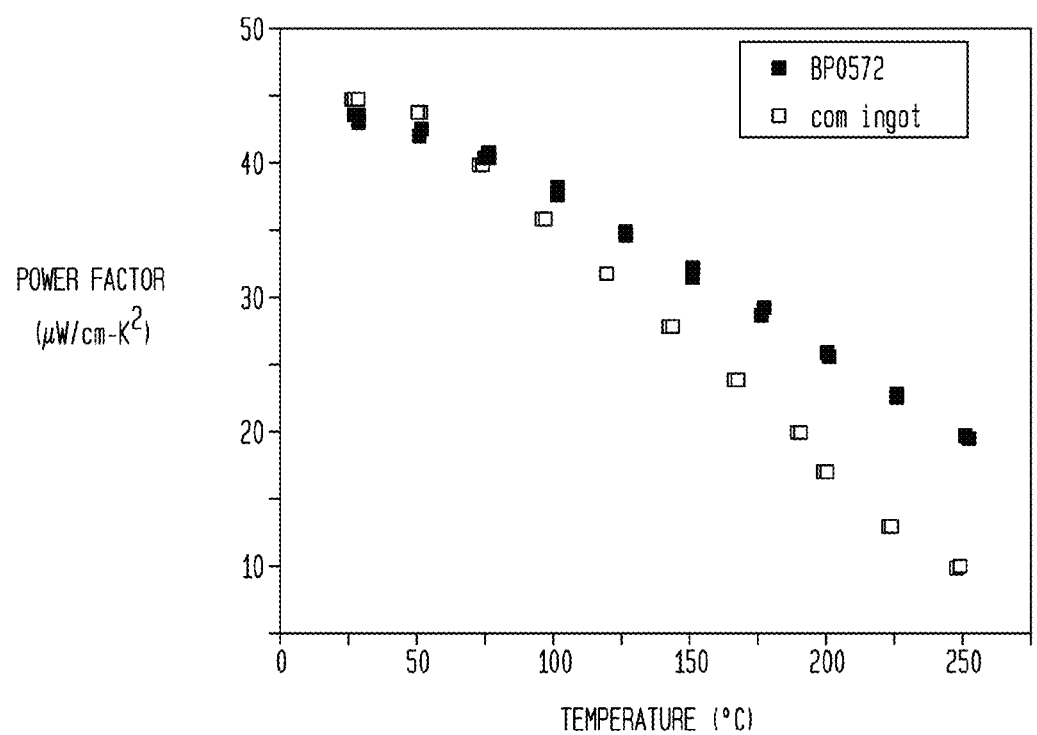
FIG. 7 is a graph depicting the temperature dependence of the power factor for a thermoelectric material prepared from the particles of FIG. 2 and a state-of-the-art bulk material of p-type BiSbTe alloy, consistent with some embodiments.

FIG. 6 presents the temperature dependencies of the Seebeck coefficient for the nanocrystalline and commercial samples, while FIG. 7 compares the power factor ($S^2\sigma$) temperature dependencies of the samples. The Seebeck coefficients were measured by a static DC method based on the slope of a voltage vs. temperature-difference curve, using commercial equipment (ZEM-3, Ulvac, Inc.) on the same bar-type sample with a dimension of 2×2 mm² in cross-section and 12 mm in length, cut along the disk plane. These properties were also measured on a home-made system on the same sample. The two sets of measurements are within 5% of each other. The Seebeck coefficient of the nanocrystalline sample is either slightly lower or higher than that of the ingot depending on temperature, which makes the power factor of the nanocrystalline sample comparable to that of the commercial ingot below 75° C. and higher than that of the commercial ingot above 75° C.

Figure 8:
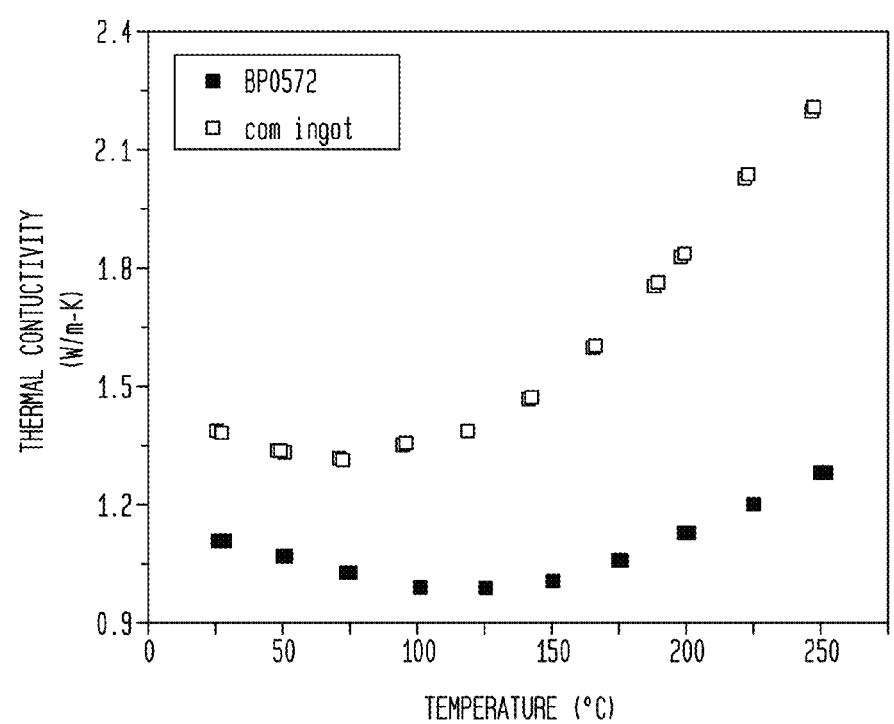
FIG. 8 is a graph depicting the temperature dependence of the thermal conductivity for a thermoelectric material prepared from the particles of FIG. 2 and a state-of-the-art bulk material of p-type BiSbTe alloy, consistent with some embodiments.

FIG. 8 depicts the temperature dependencies of the thermal conductivity for the nanocrystalline and commercial samples. The thermal conductivities are derived from measurements of the thermal diffusivities and the heat capacities of the samples. The thermal diffusivity was measured by a laser-flash method on a disk along the disk axial direction using a commercial system (Netzsch Instruments, Inc.). After the laser-flash measurements, bars were diced from the disks and their thermal diffusivities were measured along the bar (disk-plane) direction using an Angstrom method in the home-built system. The thermal diffusivity values of the bar and of the disk are in agreement within 5%.

Figure 9:
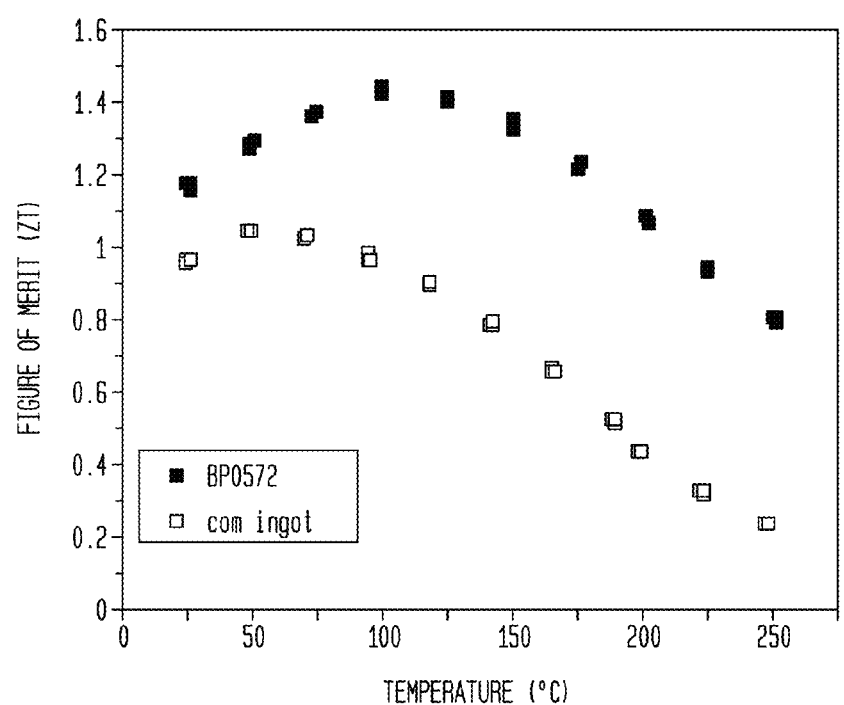
FIG. 9 is a graph depicting the temperature dependence of the figure of merit, ZT, for a thermoelectric material prepared from the particles of FIG. 2 and a state-of-the-art bulk material of p-type BiSbTe alloy, consistent with some embodiments.

FIG. 9 documents the variation in the figure of merit, ZT, as a function of temperature for the nanocrystalline and commercial samples. Since the thermal conductivity of the nanocrystalline bulk samples is significantly lower than that of the commercial ingot, and more importantly the difference increases with increasing temperature, this leads to significantly enhanced ZTs in the temperature range of 20-250° C. FIG. 9 also shows that the peak ZT value is shifted to a higher temperature (100° C.). The peak ZT of nanocrystalline bulk samples is of about 1.4 at 100° C., which is significantly higher than that of the commercial $Bi_2Te_3$-based alloys. The ZT value of the commercial ingot starts to drop above 75° C., and falls below 0.25 at 250° C. In comparison, the nanocrystalline bulk samples exhibit ZTs higher than 0.8 at 250° C. Such ZT characteristics are very much desired for power generation applications since there are no good materials presently available with high ZT in this temperature range.

A detailed microstructure examination was conducted on the nanocrystalline bulk samples using a transmission electron microscope (TEM). The TEM specimens were prepared by dicing, polishing, and ion milling the bulk nanocrystalline samples. Hot-pressed nanocrystalline bulk pellets were cut into blocks of 2×3×1 mm and ground down to 2×3×0.002 mm using a mechanical Tripod Polisher. The sample was glued to a Copper grid, and milled using Precision Ion Polishing System (Gatan Inc.) for 30 minutes with incident energy of 3.2 kV and a beam current of 15 μA at an incident angle of 3.5 degrees. FIGS. 10-15 present some representative TEM micrographs, which show the main structural features observed.

Figure 10:
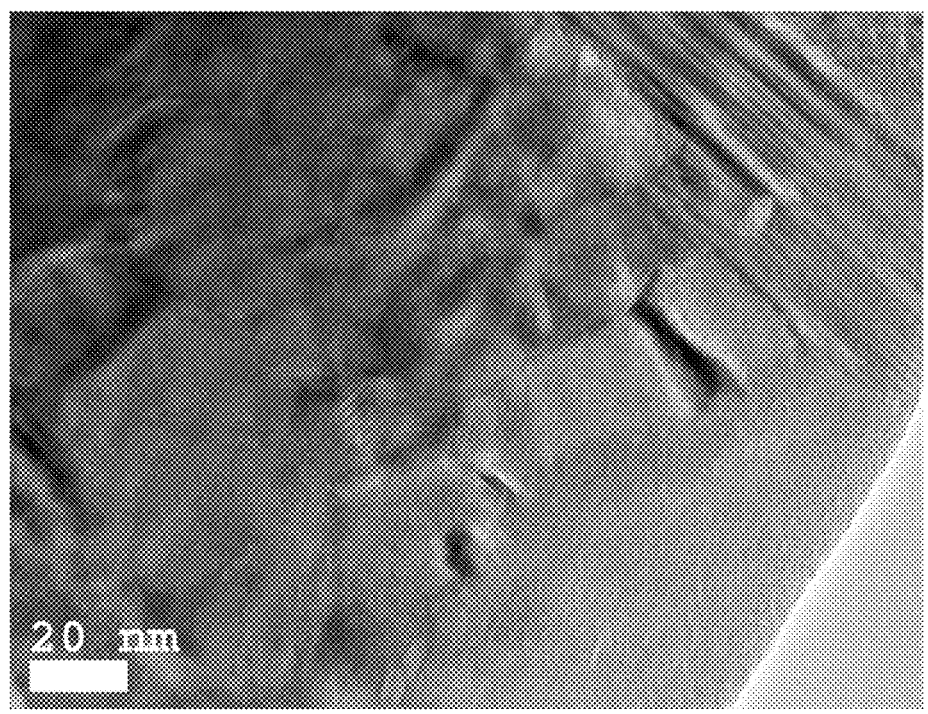
FIG. 10 is a TEM micrograph of a thermoelectric material prepared from the particles of FIG. 2.
Figure 11:
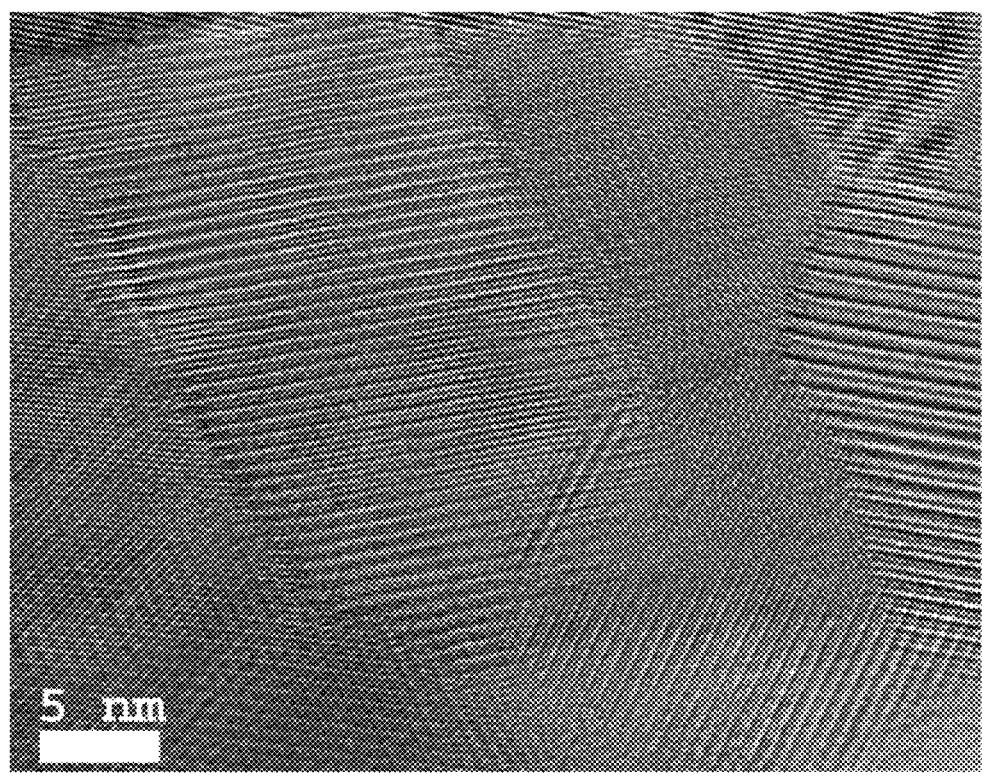
FIG. 11 is a magnified TEM micrograph of a thermoelectric material prepared from the particles of FIG. 2 showing the nano size of the closely packed nanograins.
Figure 12:
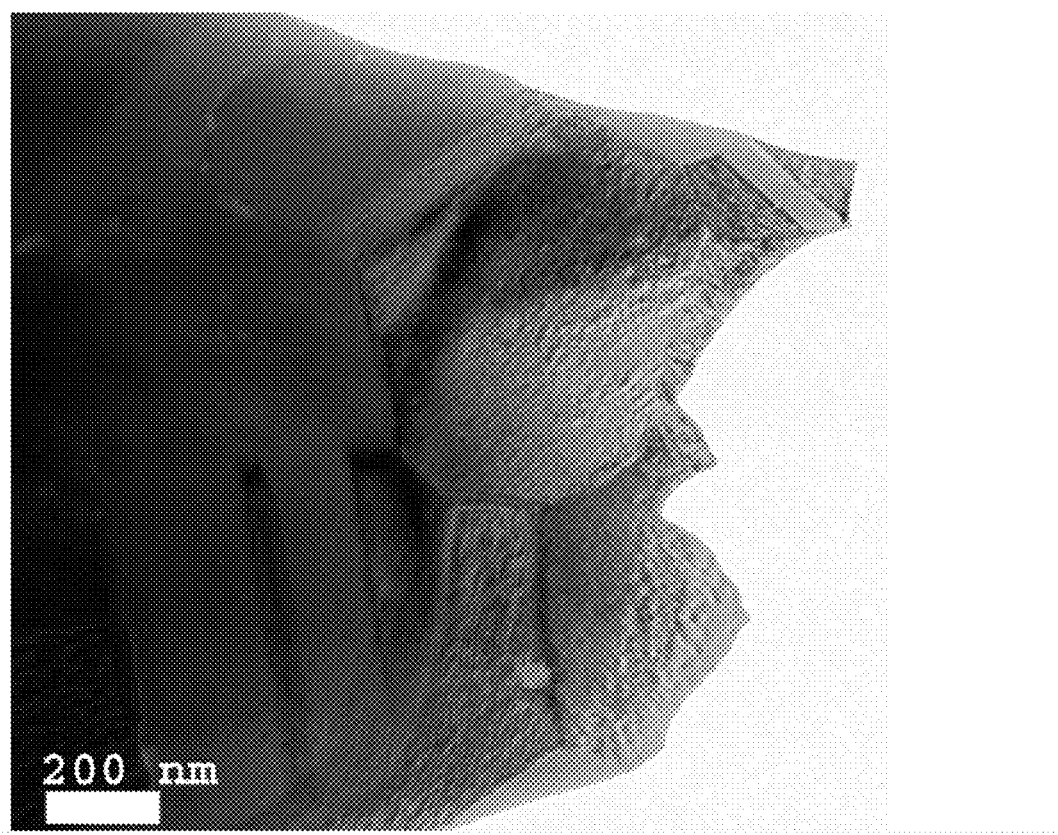
FIG. 12 is a TEM micrograph of a thermoelectric material prepared from the particles of FIG. 2 showing the presence of a grain larger than the nanograins shown in FIG. 11.
Figure 13:
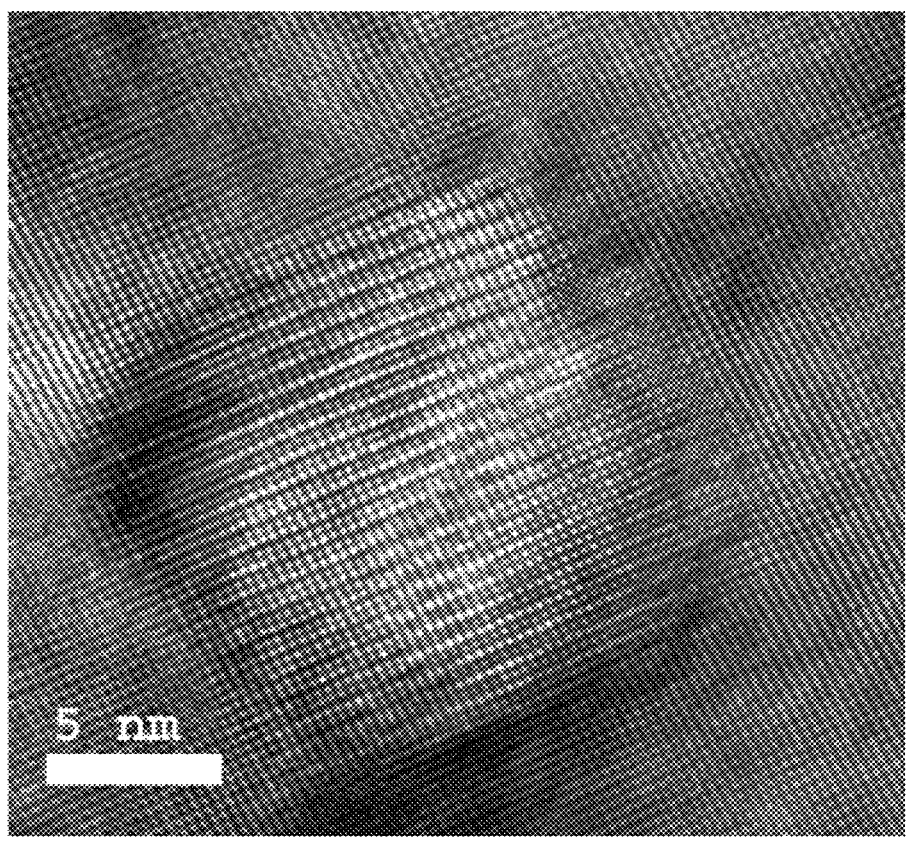
FIG. 13 is a TEM micrograph of a thermoelectric material prepared from the particles of FIG. 2 showing the presence of nanodots.
Figure 14:
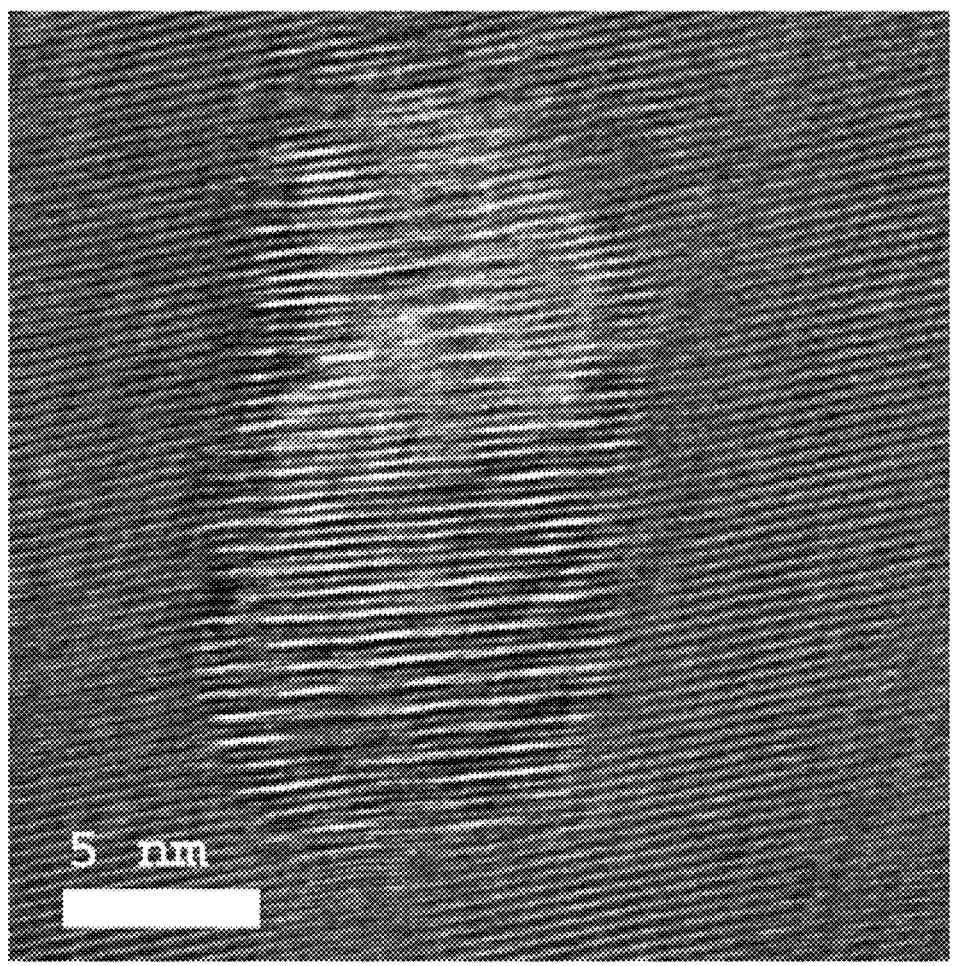
FIG. 14 is a TEM micrograph of a thermoelectric material prepared from the particles of FIG. 2 showing the presence of a nanodot with small angle boundaries.
Figure 15:
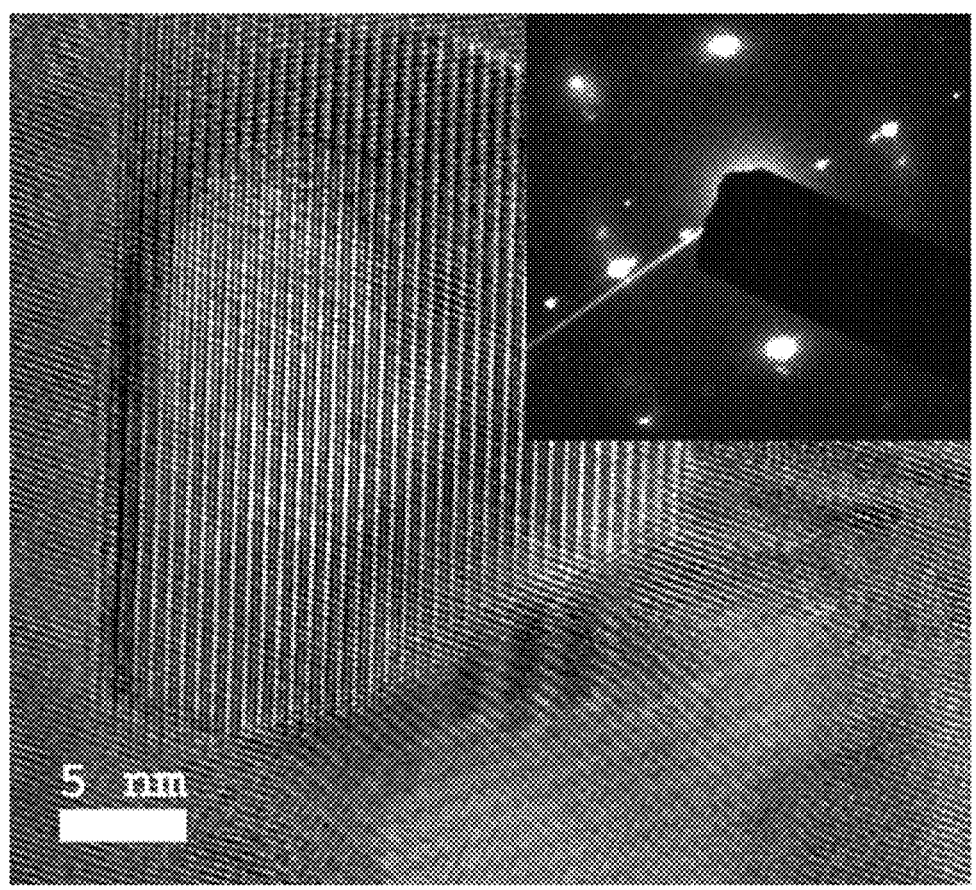
FIG. 15 is a TEM micrograph of a thermoelectric material prepared from the particles of FIG. 2 showing a Te precipitate, the inset of the figure depicting an electron diffraction pattern of the Te precipitate.

In general, as depicted in FIGS. 10 and 11, most of the grains are nanosized. Furthermore, the nanograins are highly crystalline, randomly-oriented (large angles among lattice planes) with very clean boundaries. As depicted in FIG. 11, the nanograins can be closely packed, consistent with density measurements that suggest full dense samples. Some larger grains are also present as shown in FIG. 12. High-resolution TEM microscopy, as shown in FIG. 13, reveals that these grains are composed of nanodots 2 to 10 nm in size without boundaries. These nanodots are typically Sb-rich with an exemplary composition close to Bi:Sb:Te=8:44:48; the Sb substituting for Te. Although some of the nanodots are boundaryless with the matrix as depicted in FIG. 13, other observed nanodots included small angle boundaries with the matrix as depicted in FIG. 14. Pure Te precipitates of sizes in the range from 5-30 nm were also observed, as depicted in FIG. 15. The selected-area electron diffraction pattern, shown in the inset of FIG. 15, confirmed the Te phase. Generally speaking, nanodots could be found within each 50 nm diameter area.

Without necessarily being bound by any particular theory, it can be hypothesized that these nanodots could be formed during the hot-press heating and cooling processes. The larger-sized grains containing nanodots, as depicted in FIG. 12, could be the result of non-uniform milling of the ingot during ball milling. These large grains may have grown even larger during the hot-press compaction via Oswald Ripening. Given the large population of nano interfacial features in our material, such as nanograins, nanodots may not be the only reason for the strong phonon scattering.

Example 2

Nanocrystalline SiGe Materials

Silicon and germanium elemental materials, both p and n-type, were used as starting materials and ground using a ball mill to form nanoparticles having a size of about 1-about 200 nm. These elemental materials can have a ZT lower than about 0.01 in some instances. It is also understood that a SiGe alloy could have been used to form the particles, perhaps leading to further improvement in the final manufactured material. Samples were hot pressed at a pressure of about 40-about 200 MPa and at a temperature of about 900° C.-1300° C. to form thermoelectric material samples.

Figure 16:
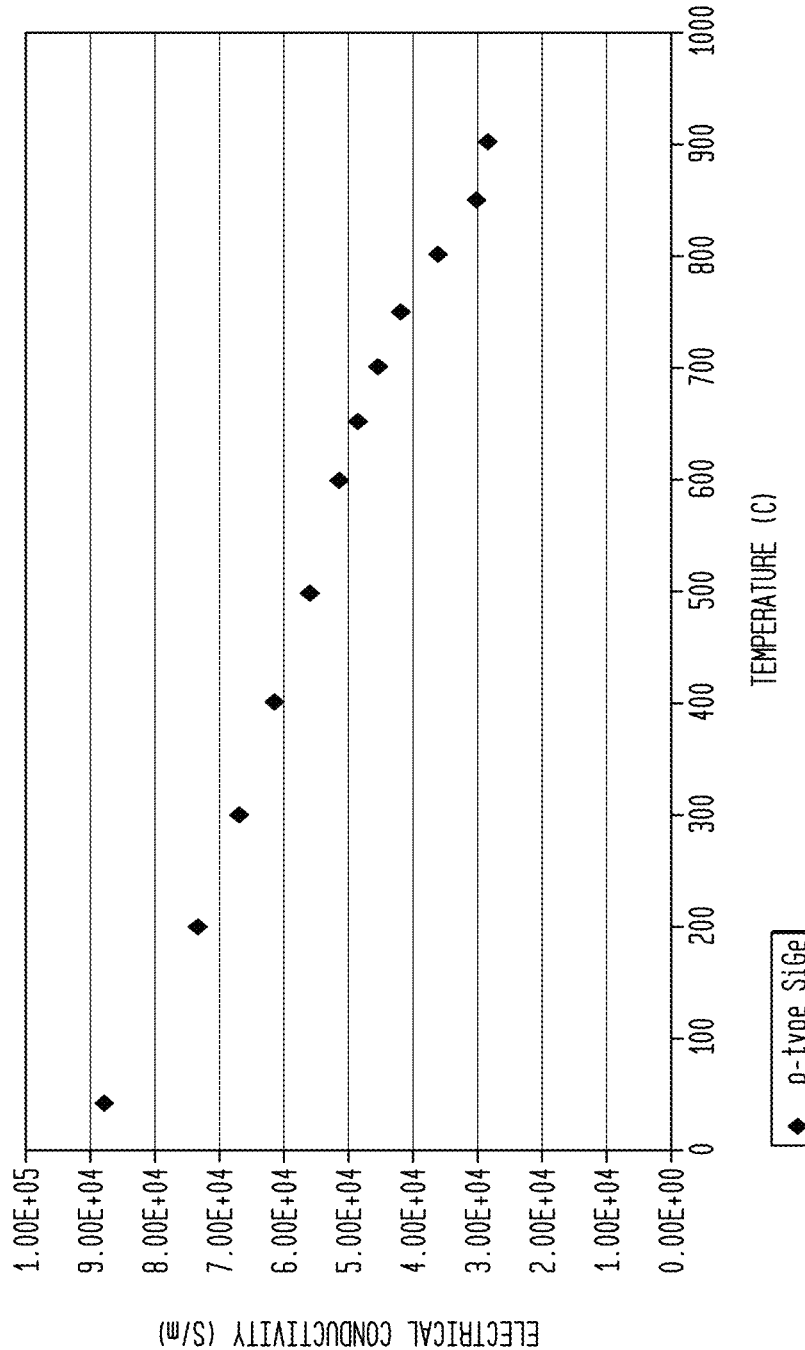
FIG. 16 is a graph depicting the temperature dependence of the electrical conductivity for a thermoelectric material prepared from a p-type SiGe bulk starting material, consistent with some embodiments.
Figure 17:
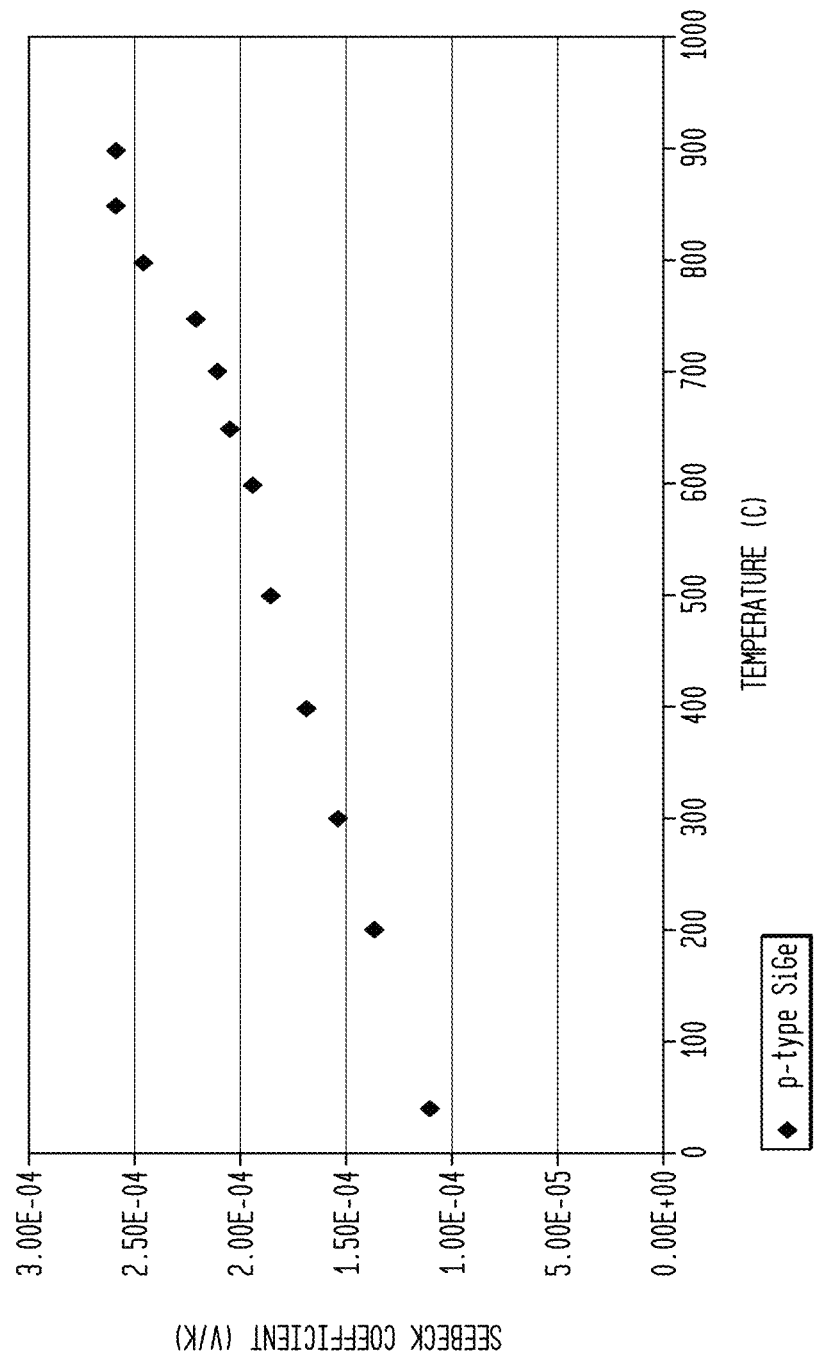
FIG. 17 is a graph depicting the temperature dependence of the Seebeck Coefficient for a thermoelectric material prepared from a p-type SiGe bulk starting material, consistent with some embodiments.
Figure 18:
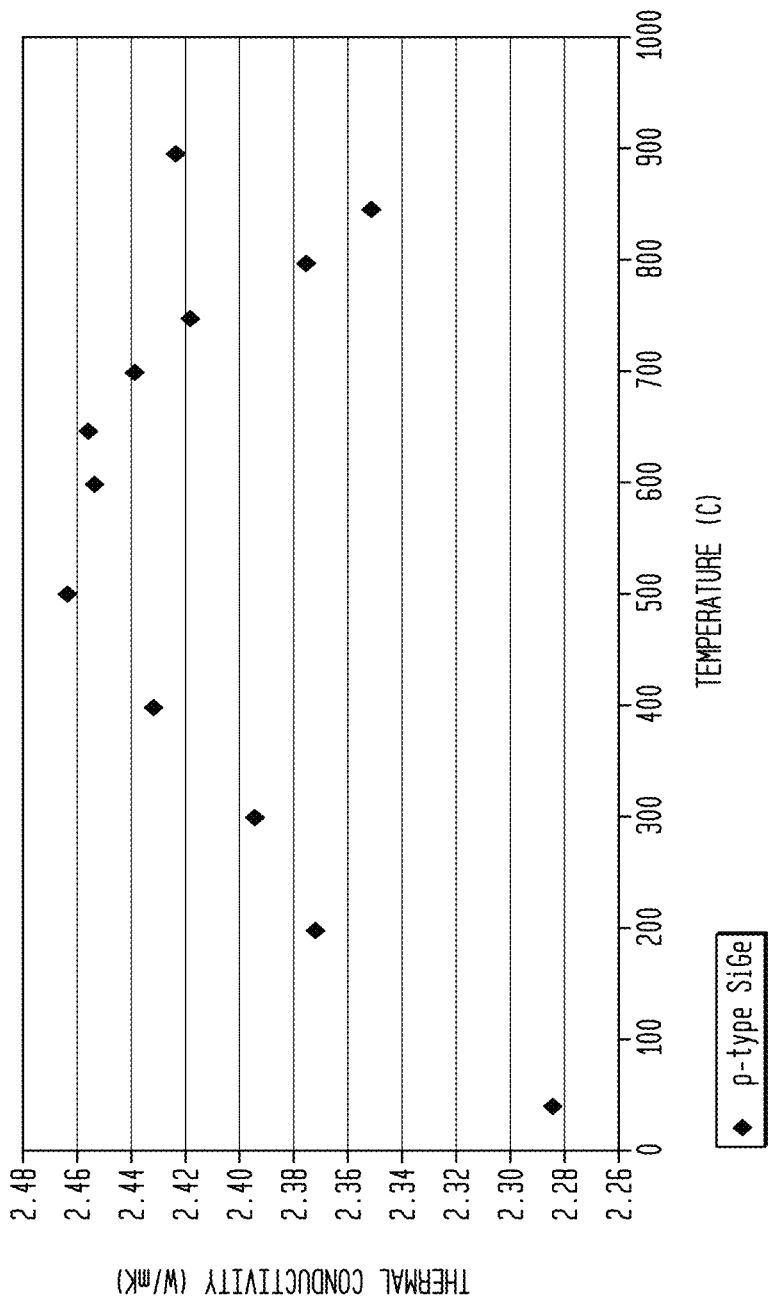
FIG. 18 is a graph depicting the temperature dependence of the thermal conductivity for a thermoelectric material prepared from a p-type SiGe bulk starting material, consistent with some embodiments.
Figure 19:
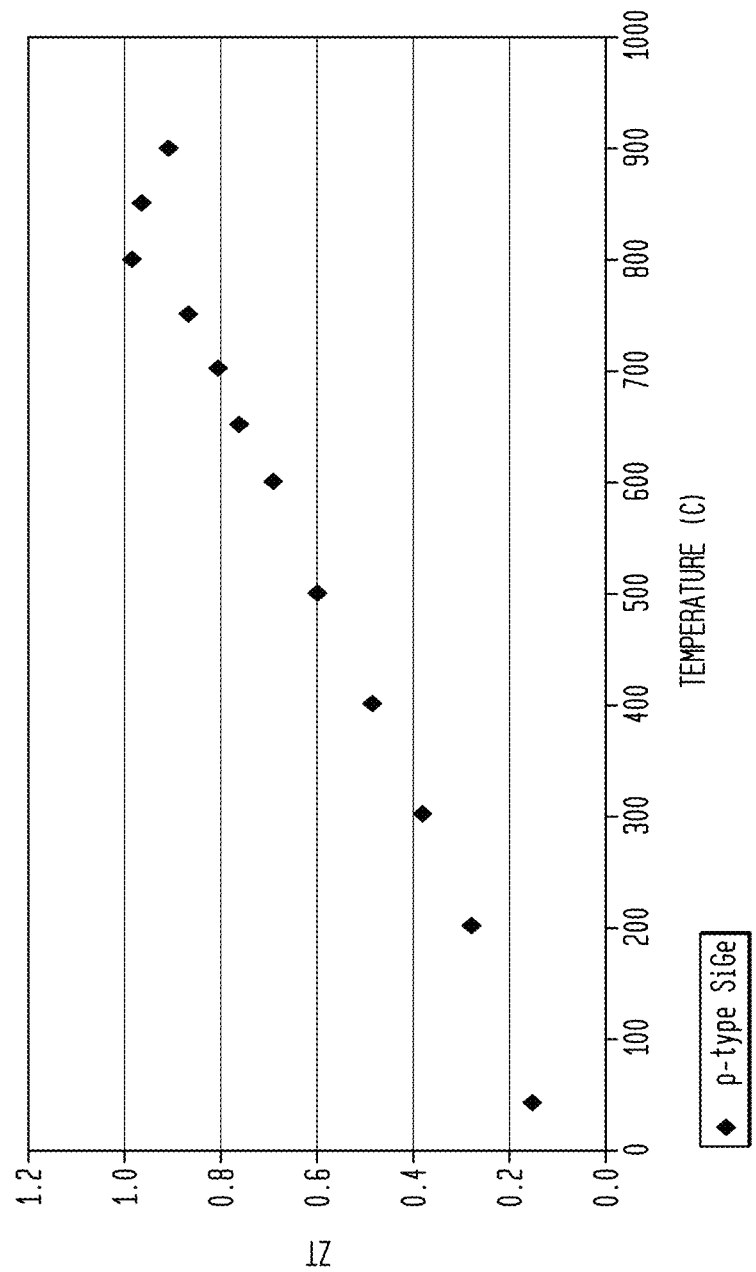
FIG. 19 is a graph depicting the temperature dependence of the figure-of-merit, ZT, for a thermoelectric material prepared from a p-type SiGe bulk starting material, consistent with some embodiments.

FIGS. 16-19 depict graphs showing the temperature dependence of various properties of a hot pressed nanocrystalline material formed from a p-type SiGe ball milled bulk material. The properties were measured using the same techniques as described earlier for FIGS. 5-9. FIG. 16 shows the temperature dependence of the electrical conductivity of the nanocrystalline p-type SiGe sample. FIG. 17 presents the temperature dependence of the Seebeck coefficient for the nanocrystalline p-type SiGe sample. FIG. 18 depicts the temperature dependencies of the thermal conductivity for the p-type SiGe sample. FIG. 19 documents the variation in the figure of merit, ZT, as a function of temperature for the nanocrystalline p-type SiGe sample.

Figure 20:
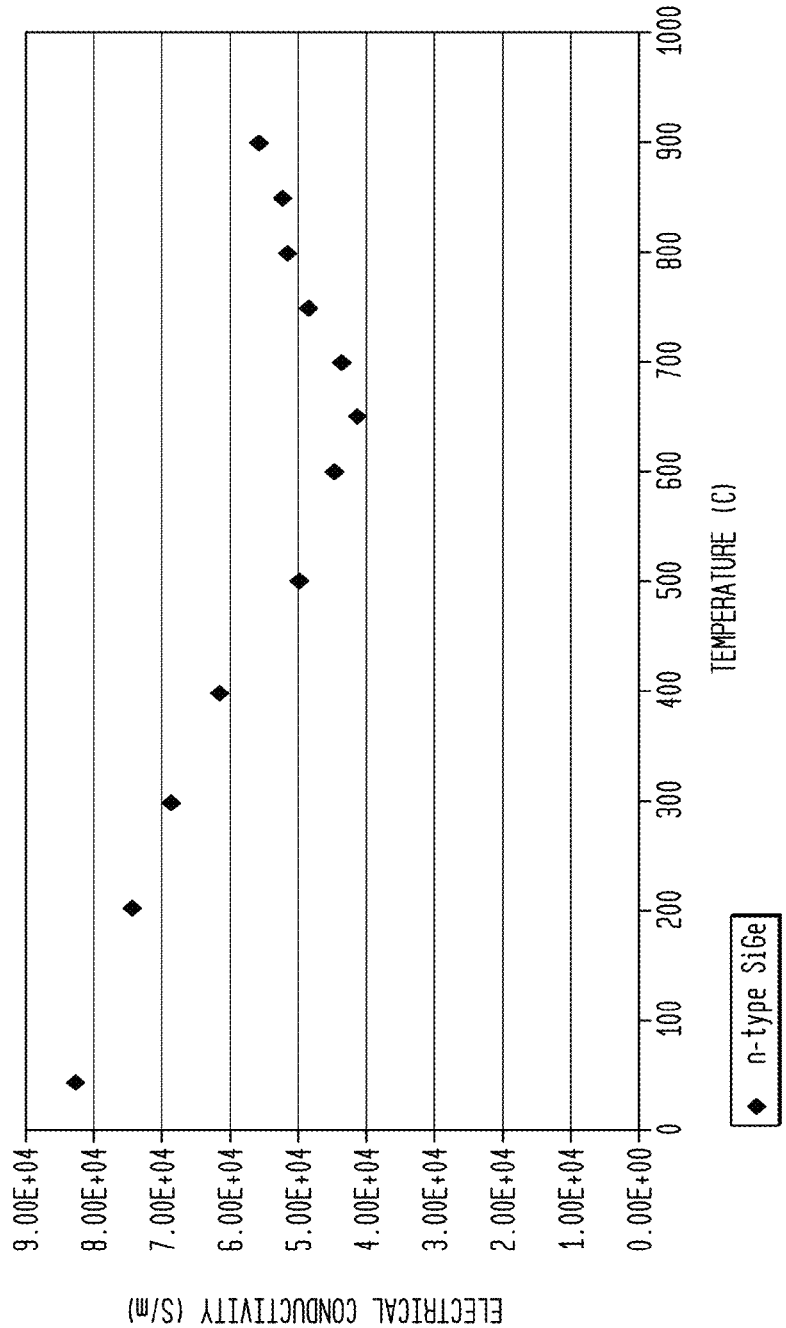
FIG. 20 is a graph depicting the temperature dependence of the electrical conductivity for a thermoelectric material prepared from a n-type SiGe bulk starting material, consistent with some embodiments.
Figure 21:
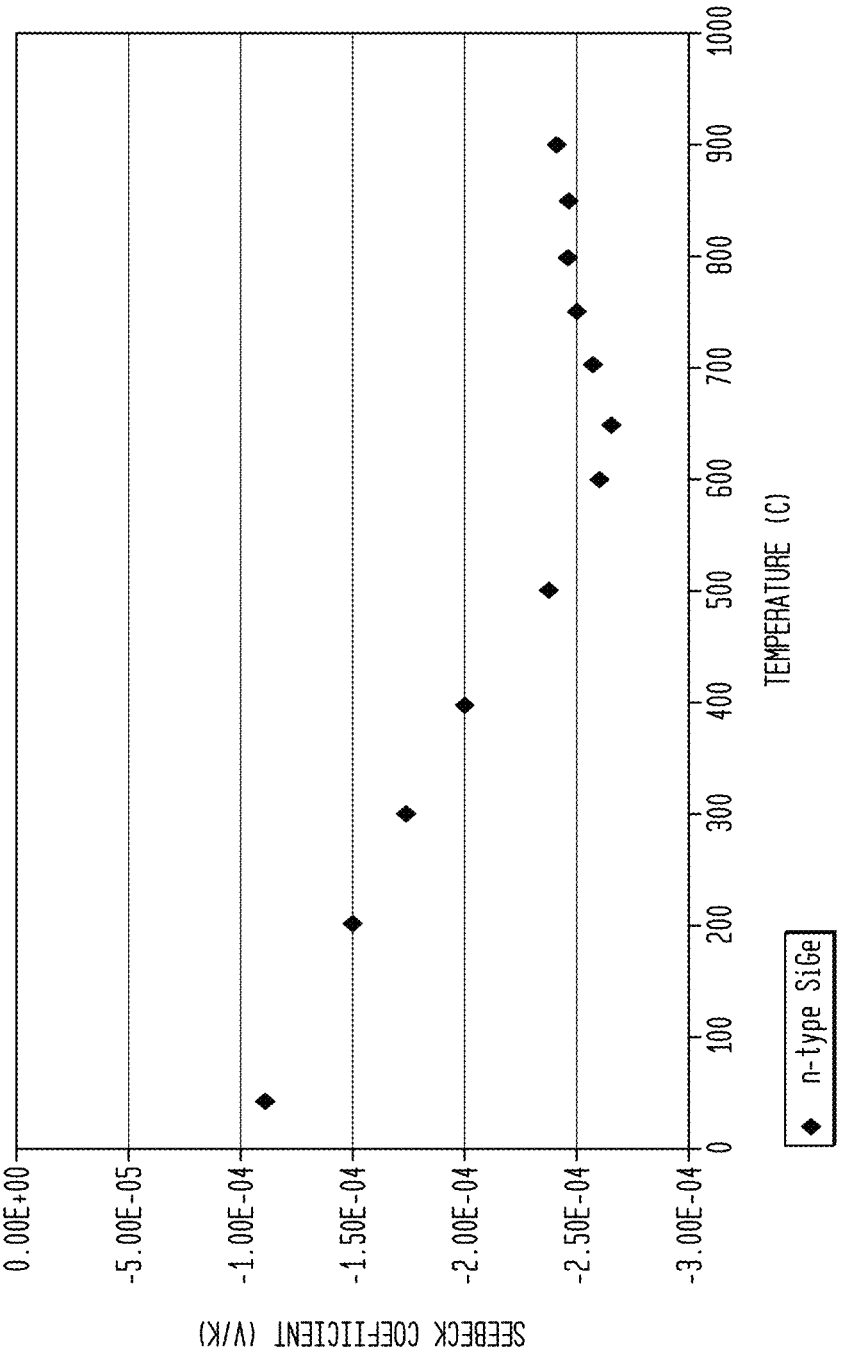
FIG. 21 is a graph depicting the temperature dependence of the Seebeck Coefficient for a thermoelectric material prepared from a n-type SiGe bulk starting material, consistent with some embodiments.
Figure 22:
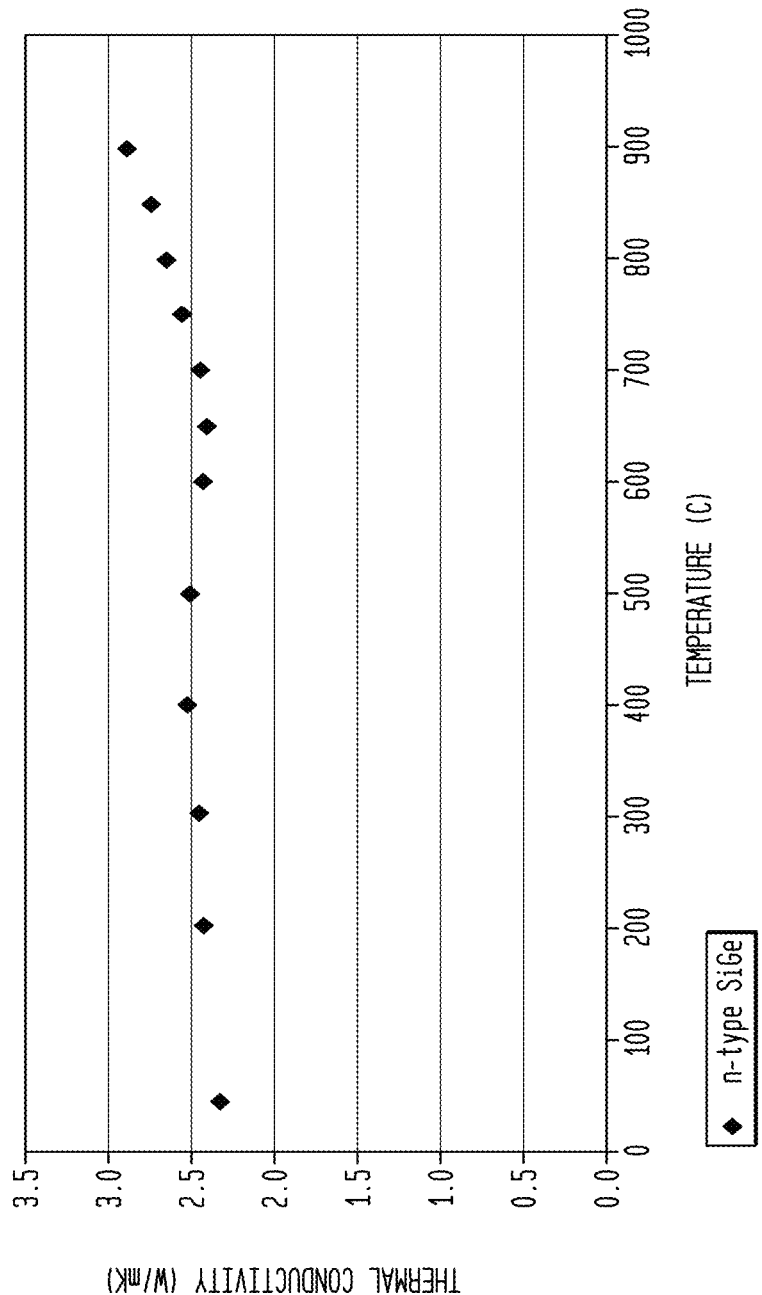
FIG. 22 is a graph depicting the temperature dependence of the thermal conductivity for a thermoelectric material prepared from a n-type SiGe bulk starting material, consistent with some embodiments.
Figure 23:
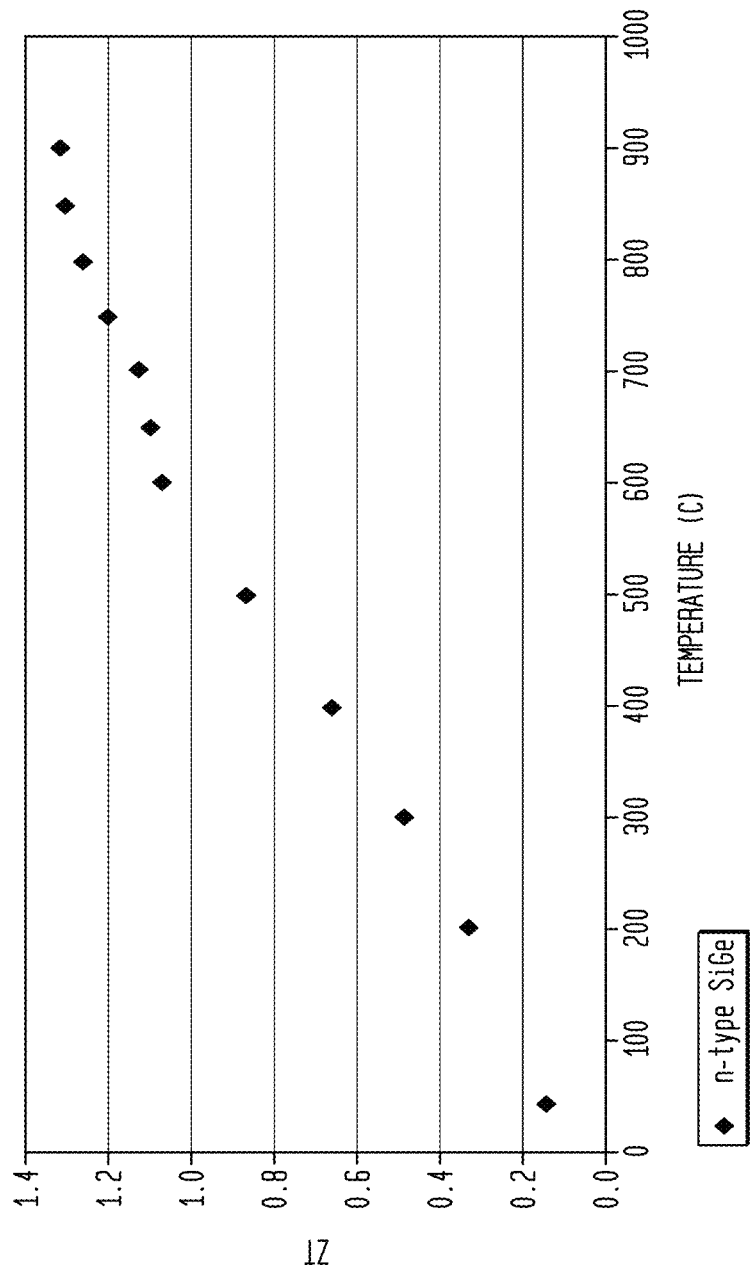
FIG. 23 is a graph depicting the temperature dependence of the figure-of-merit, ZT, for a thermoelectric material prepared from a n-type SiGe bulk starting material, consistent with some embodiments.

FIGS. 20-23 depict graphs showing the temperature dependence of various properties of a hot pressed nanocrystalline material formed from a n-type SiGe ball milled bulk material. FIG. 20 shows the temperature dependence of the electrical conductivity of the nanocrystalline n-type SiGe sample. FIG. 17 presents the temperature dependence of the Seebeck coefficient for the nanocrystalline n-type SiGe sample. FIG. 18 depicts the temperature dependencies of the thermal conductivity for the n-type SiGe sample. FIG. 19 documents the variation in the figure of merit, ZT, as a function of temperature for the nanocrystalline n-type SiGe sample.

Figure 24:
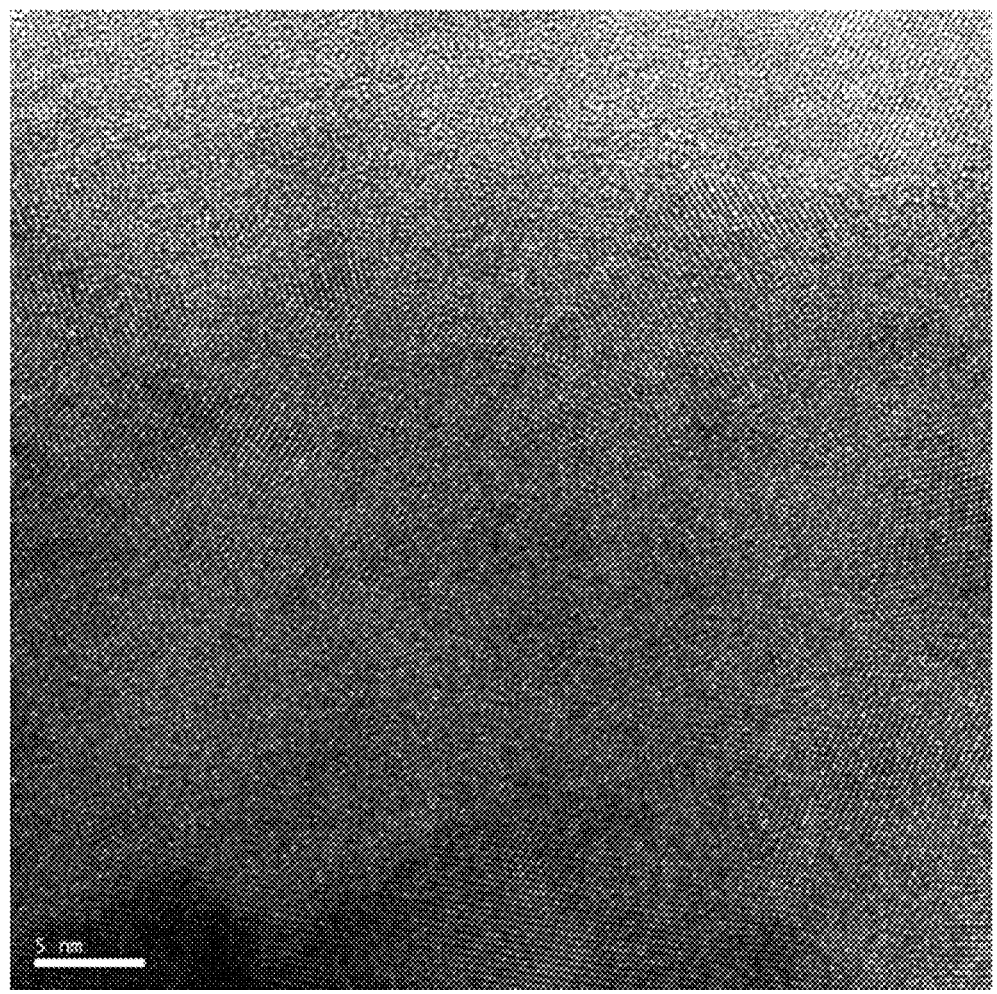
FIG. 24 is a TEM micrograph of a ball milled sample of SiGe bulk starting material, consistent with some embodiments of the present invention.
Figure 25:
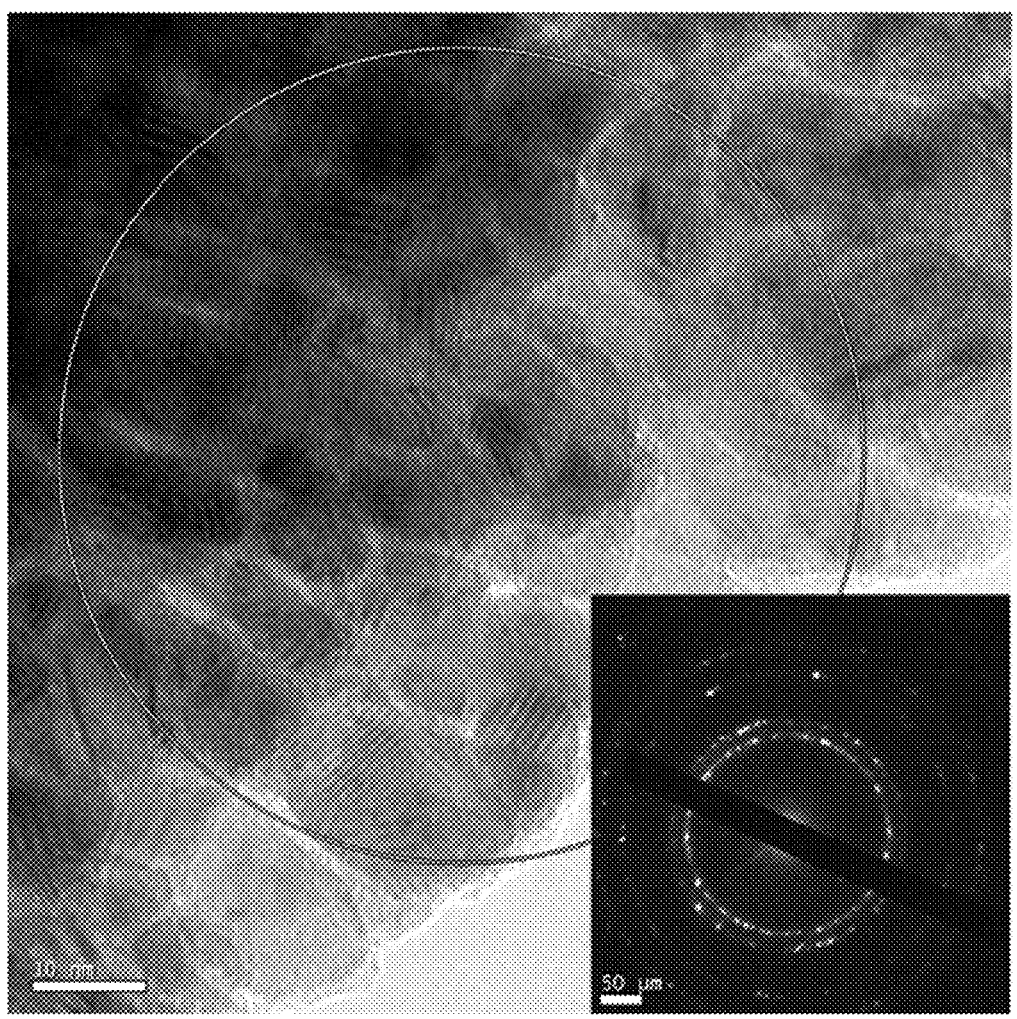
FIG. 25 is a TEM micrograph of the particles of FIG. 24 after hot pressing, the inset showing a corresponding electron diffraction pattern on the sample.
Figure 26:
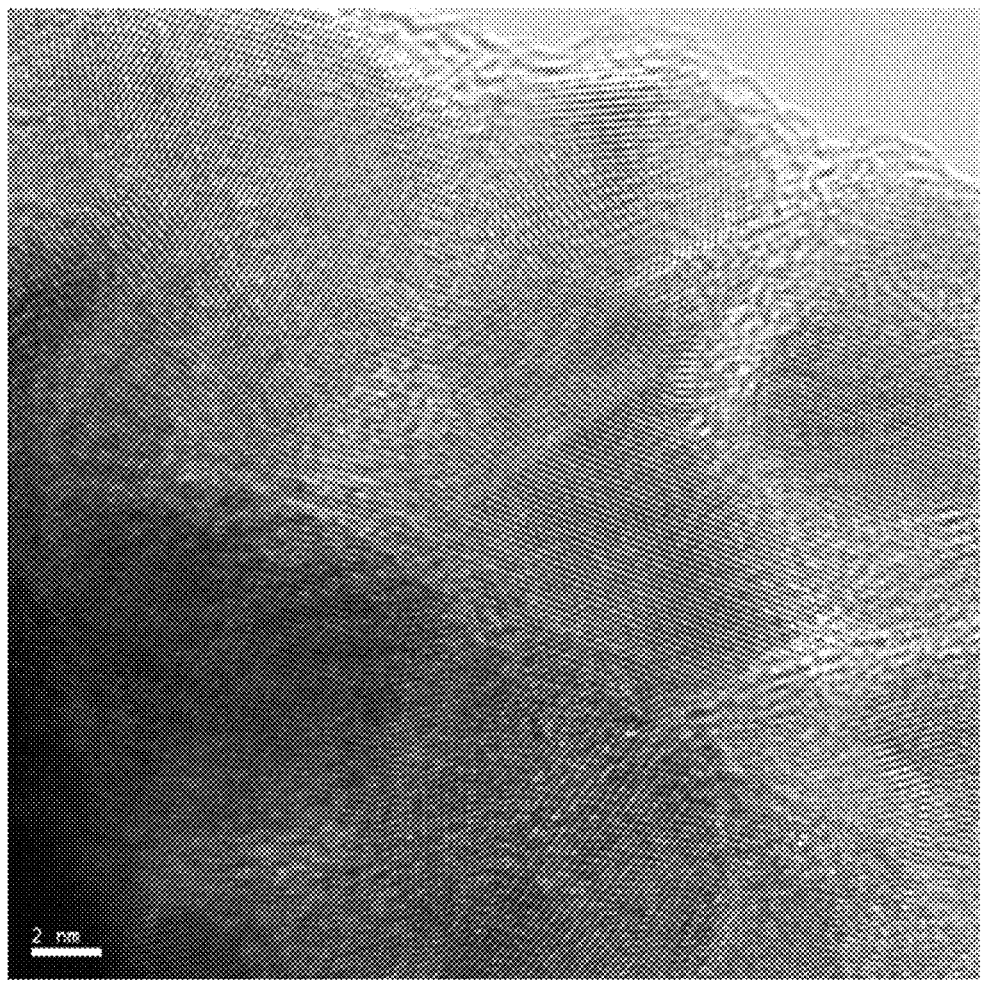
FIG. 26 is a high-resolution TEM micrograph of the hot pressed sample shown in FIG. 25.
Figure 27:
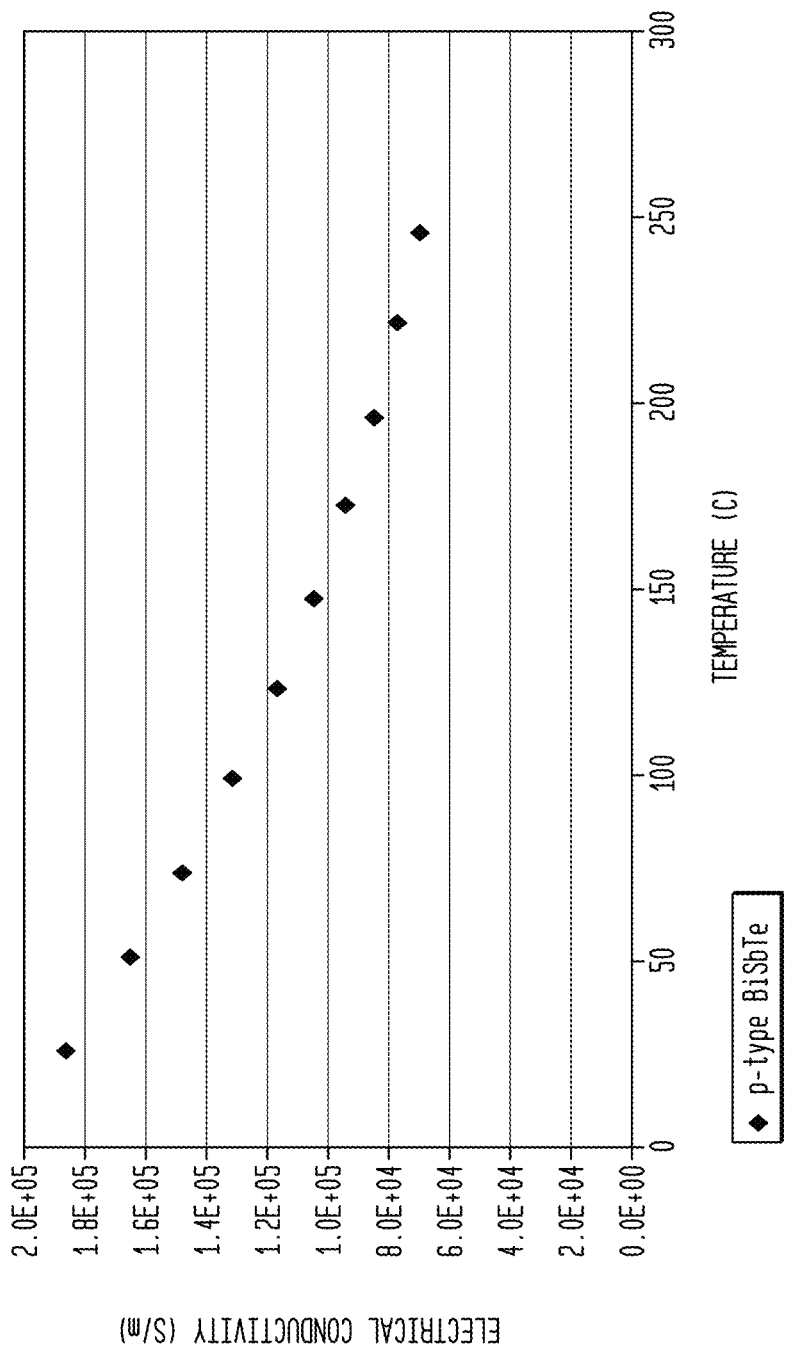
FIG. 27 is a graph depicting the temperature dependence of the electrical conductivity for a thermoelectric material prepared from a p-type $Bi_{0.3}Sb_{1.7}Te_3$ bulk starting material, consistent with some embodiments.
Figure 28:
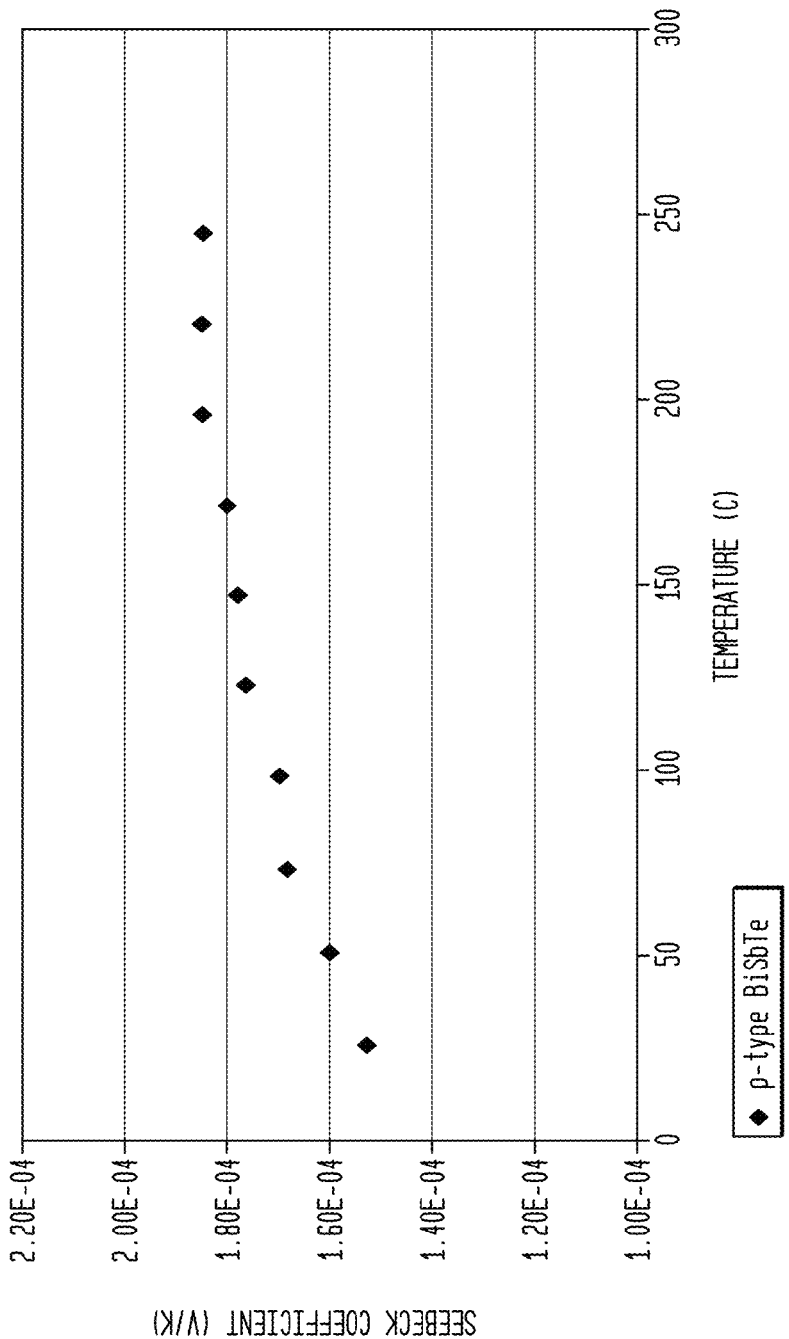
FIG. 28 is a graph depicting the temperature dependence of the Seebeck Coefficient for a thermoelectric material prepared from a p-type $Bi_{0.3}Sb_{1.7}Te_3$ bulk starting material, consistent with some embodiments.
Figure 29:
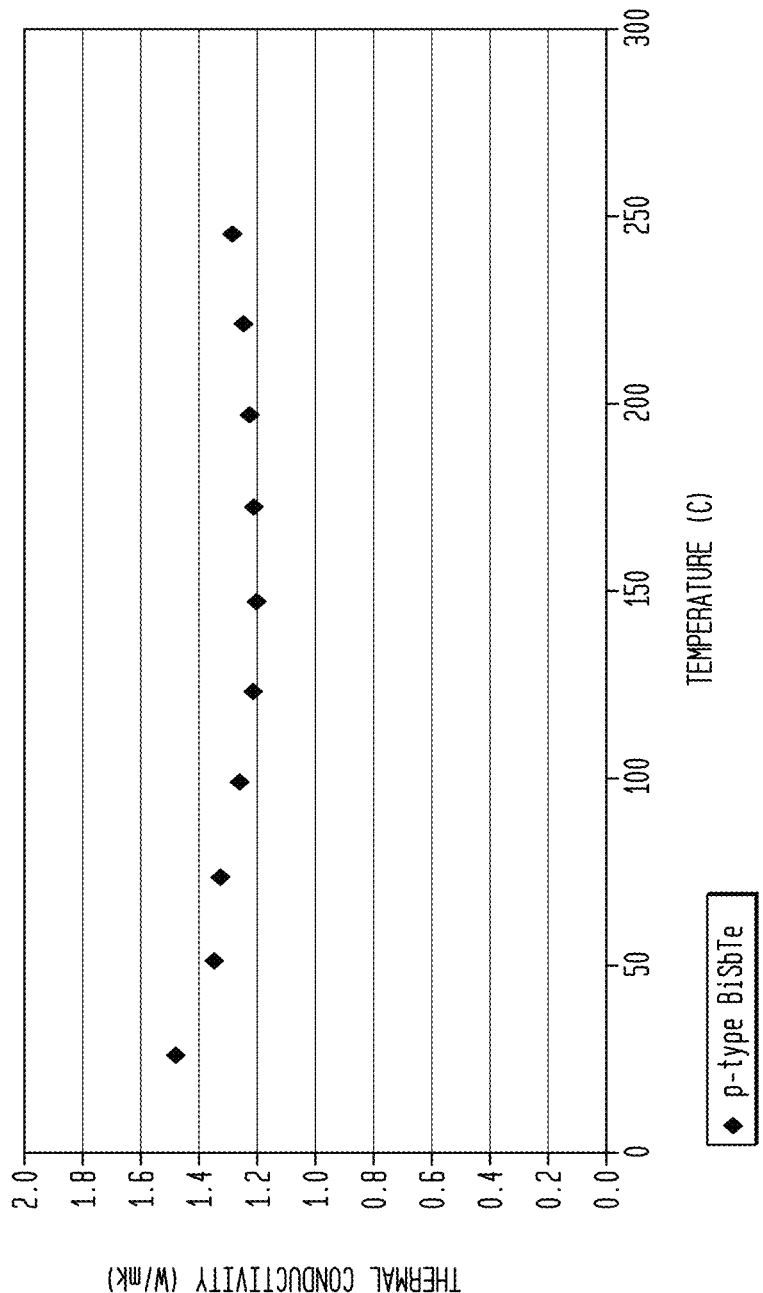
FIG. 29 is a graph depicting the temperature dependence of the thermal conductivity for a thermoelectric material prepared from a p-type $Bi_{0.3}Sb_{1.7}Te_3$ bulk starting material, consistent with some embodiments.

FIGS. 24-26 depict TEM micrographs of p-type SiGe materials associated with nanocrystalline materials. FIG. 24 presents a TEM micrograph of a ball-milled powder sample of SiGe bulk material, showing the nano-sized particulates of the milled particulates. FIG. 25 presents a TEM micrograph of a SiGe powder sample after hot pressing. The micrograph shows numerous grains of the hot-pressed material which are densely packed and in the nano-sized range. The inset of FIG. 25 presents a selected-area electron diffraction pattern taken on the sample. FIG. 26 presents a high-resolution TEM of the hot-pressed SiGe sample, further showing the nano size of the various grains of the sample, indicating lots of grain boundaries that are designed for phonon scattering.

Example 3

Temperature Tailoring of Nanocrystalline p-Type BiSbTe Materials

Samples of nanocrystalline p-type BiSbTe alloyed materials were prepared to demonstrate how the figure of merit, ZT, can be tailored to various temperature conditions. In particular, $Bi_xSb_{2-x}Te_3$ type materials can be prepared with various stoichiometries depending upon the value of x selected. Two particular example types of samples were prepared: p-type nanocrystalline, hot pressed materials having a stoichiometry of $Bi_{0.3}Sb_{1.7}Te_3$, and p-type nanocrystalline, hot pressed materials having a stoichiometry of $Bi_{0.5}Sb_{1.5}Te_3$. Appropriate bulk starting materials were ground up by a ball mill to form nanoparticle samples. The samples are pressed at 40-160 MPa and 450° C.-600° C. for up to about 5 minutes.

Figure 30:
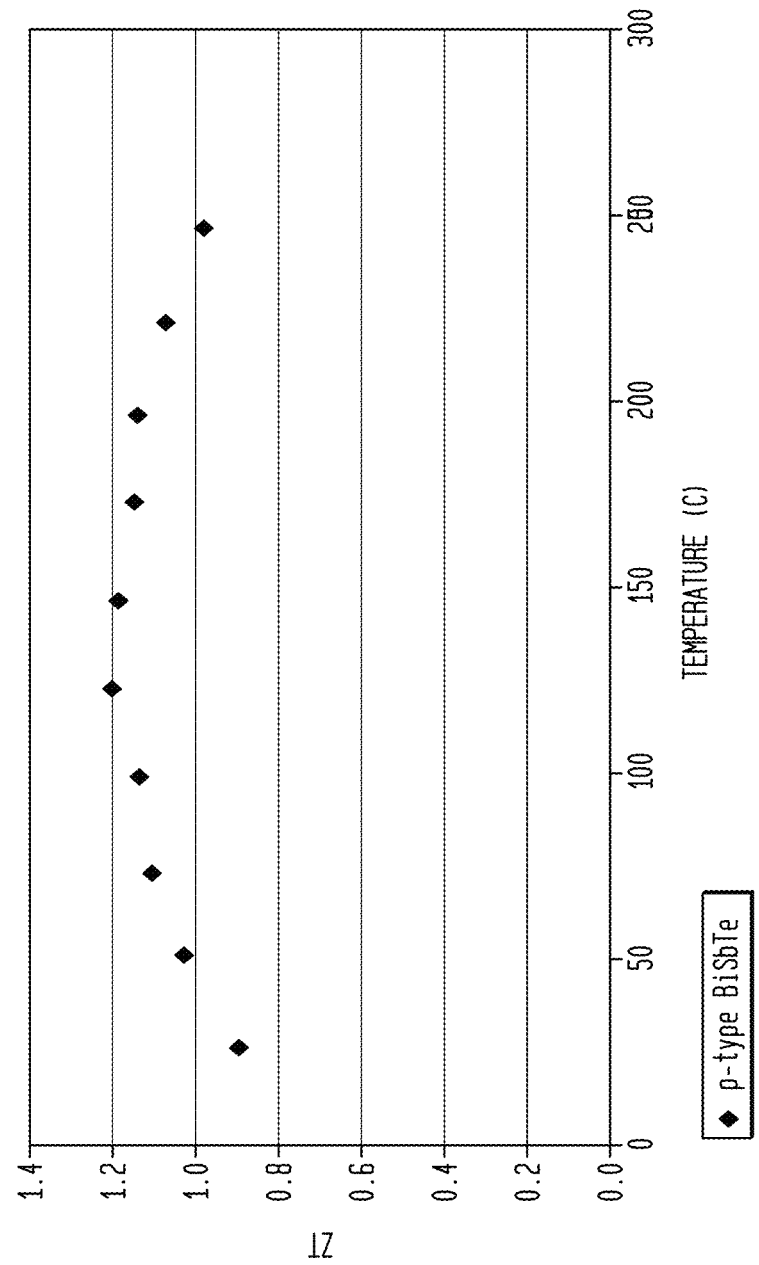
FIG. 30 is a graph depicting the temperature dependence of the figure of merit, ZT, for a thermoelectric material prepared from a p-type $Bi_{0.3}Sb_{1.7}Te_3$ bulk starting material, consistent with some embodiments.
Figure 31:
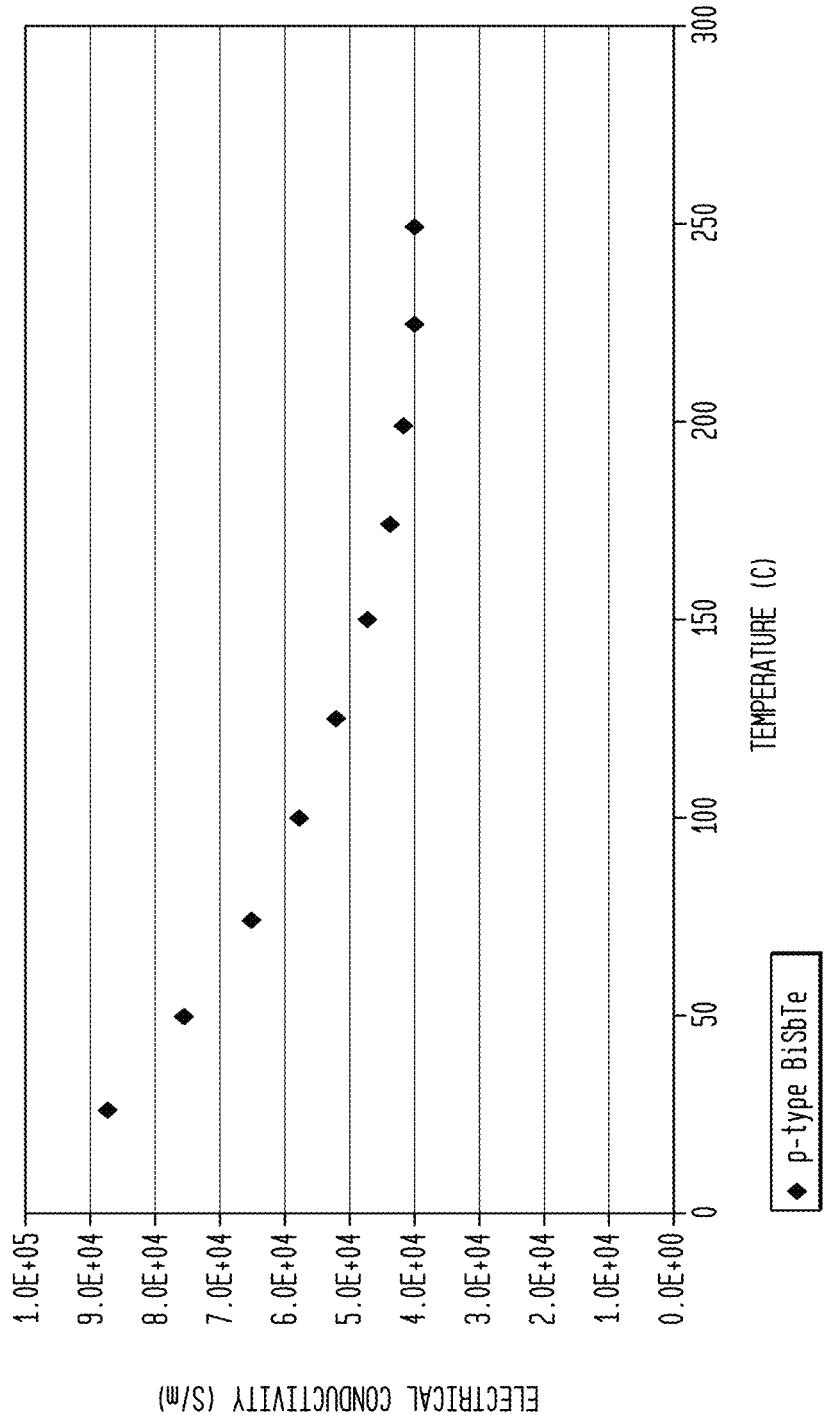
FIG. 31 is a graph depicting the temperature dependence of the electrical conductivity for a thermoelectric material prepared from a p-type $Bi_{0.5}Sb_{1.5}Te_3$ bulk starting material, consistent with some embodiments.
Figure 32:
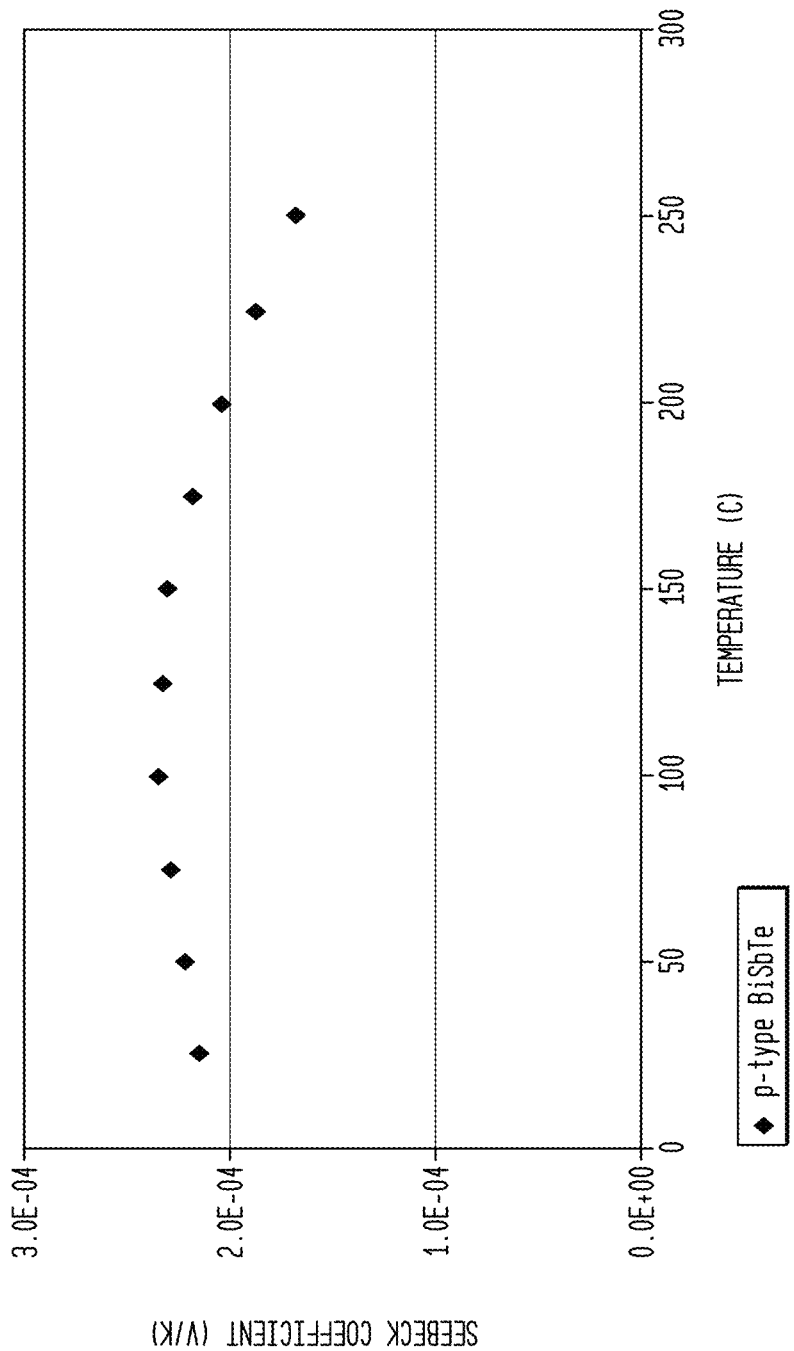
FIG. 32 is a graph depicting the temperature dependence of the Seebeck Coefficient for a thermoelectric material prepared from a p-type $Bi_{0.5}Sb_{1.5}Te_3$ bulk starting material, consistent with some embodiments.
Figure 33:
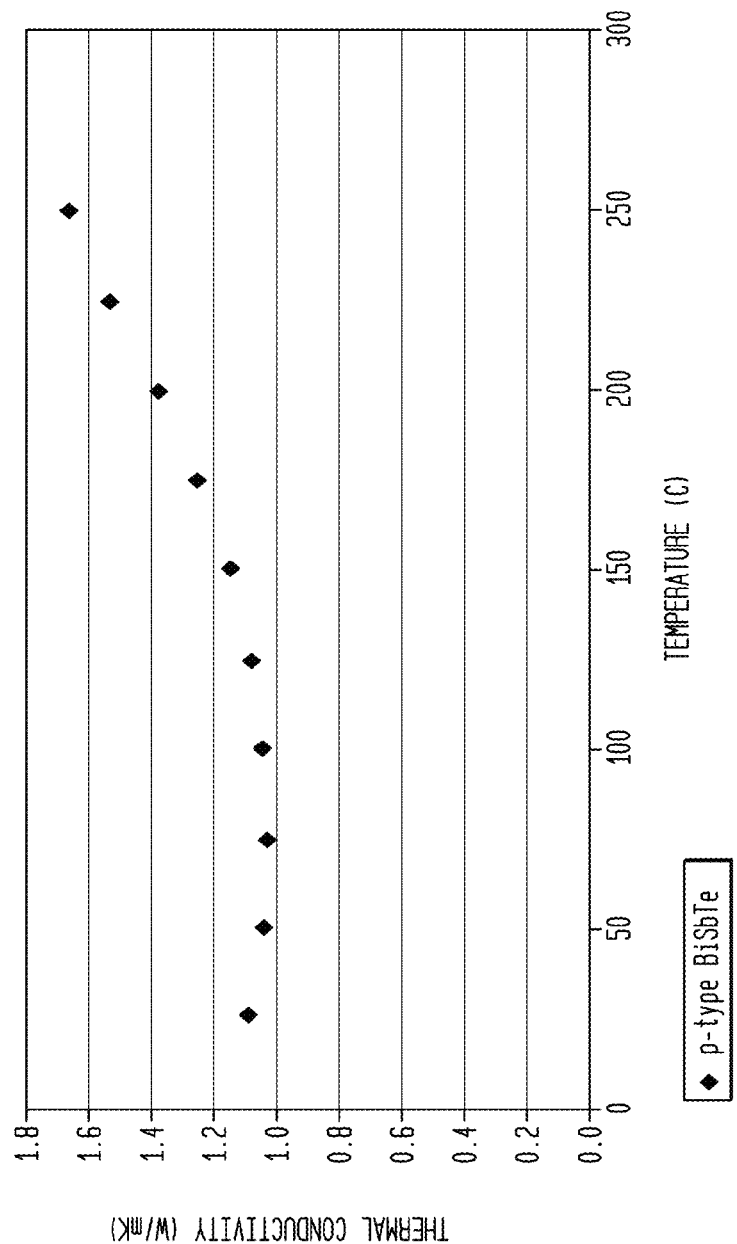
FIG. 33 is a graph depicting the temperature dependence of the thermal conductivity for a thermoelectric material prepared from a p-type $Bi_{0.5}Sb_{1.5}Te_3$ bulk starting material, consistent with some embodiments.
Figure 34:
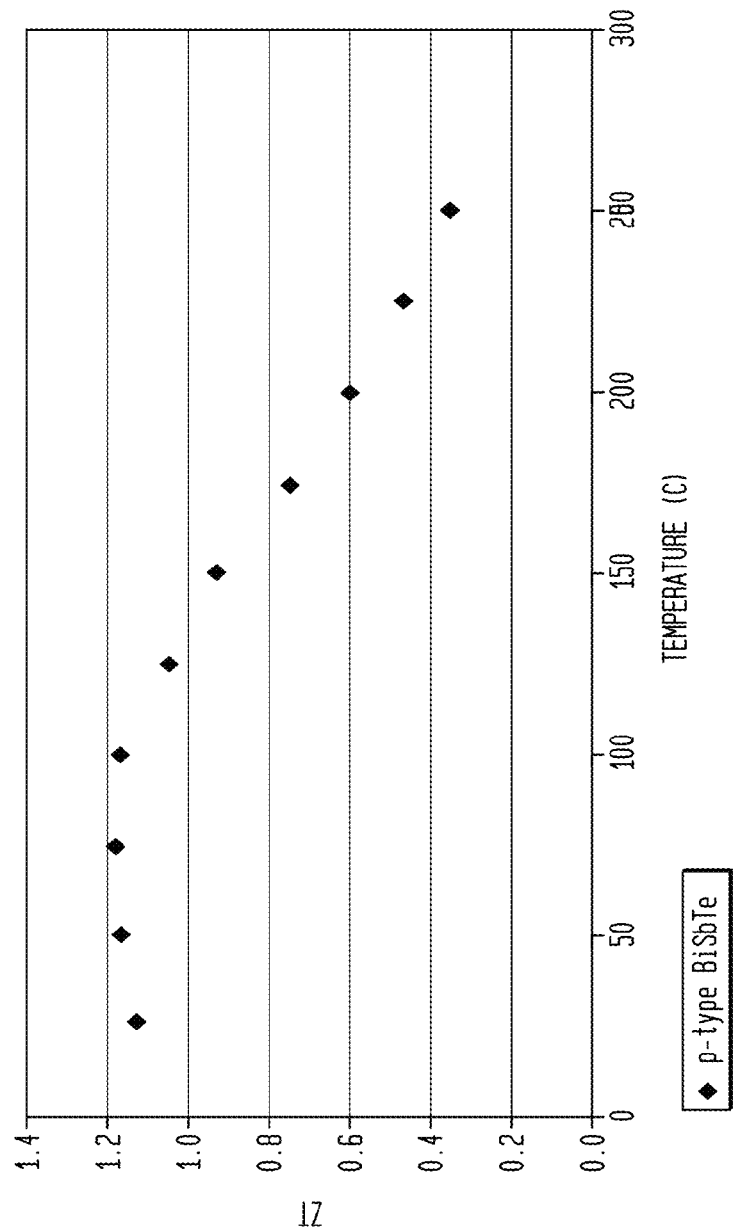
FIG. 34 is a graph depicting the temperature dependence of the figure of merit, ZT, for a thermoelectric material prepared from a p-type $Bi_{0.5}Sb_{1.5}Te_3$ bulk starting material, consistent with some embodiments.

FIGS. 27-30 depict the temperature dependence of the electrical conductivity, Seebeck coefficient, thermal conductivity, and ZT, respectively, for nanocrystalline $Bi_{0.3}Sb_{1.7}Te_3$ samples, while FIGS. 31-34 depict the temperature dependence of the electrical conductivity, Seebeck coefficient, thermal conductivity, and ZT, respectively, for nanocrystalline $Bi_{0.5}Sb_5Te_3$ samples. The measurements were carried in accord as described in Example 1. As can be seen in FIGS. 30 and 34, the peak ZT value for a $Bi_{0.3}Sb_{1.7}Te_3$ sample was measured at about 150° C., while the peak ZT value for a $Bi_{0.5}Sb_{1.5}Te_3$ sample was measured at about 75° C.

Accordingly, the results show that a nanocrystalline material's peak ZT can be tailored for particular temperature range applications. For example, the lower temperature peak material can be utilized in applications adapted for closer to room temperature use, such as cooling—while the higher temperature peak material can be utilized in applications for high temperature such as power generation.

It is understood that the various embodiments discussed herein, along with the experimental results, describe a variety of methods and materials that are merely representative of the scope of the present invention. Indeed, those skilled in the art will readily appreciate that many other modifications to the methods and materials disclosed herein can be made. All such modifications represent related embodiments that are also within the scope of the present invention. As well, all numbers expressing quantities of ingredients, reaction conditions, and so forth used in the specification and claims are to be understood as being modified in all instances by the term "about." Accordingly, unless indicated to the contrary, the numerical parameters set forth in this specification and attached claims are approximations that can vary depending upon the desired properties.

What is claimed is:

1. A method of forming a semiconductor alloy thermoelectric material, comprising:
   providing at least two different elemental powders;
   mechanically alloying the at least two different elemental powders to form a semiconductor alloy powder comprising semiconductor alloy nanoparticles; and
   compacting the semiconductor alloy powder under pressure and at an elevated temperature to generate the semiconductor alloy thermoelectric material with a ZT value greater than 1.2 for at least one temperature in a range of room temperature to 300° C.;
   wherein:
   a current is passed through the semiconductor alloy powder during the step of compacting;
   the semiconductor alloy thermoelectric material comprises randomly oriented grains having an average grain size below 5000 nm and precipitation regions having an average size of 1 nm to 100 nm; wherein the semiconductor alloy thermoelectric material comprises a bismuth telluride or bismuth antimony telluride based material; and the step of providing at least two different elemental powders comprises providing at least a bismuth elemental powder and a tellurium elemental powder, or at least a bismuth elemental powder, an antimony elemental powder and a tellurium elemental powder.

2. The method of claim 1, wherein:
   the step of mechanically alloying comprises milling the at least two different elemental powders;
   the semiconductor alloy nanoparticles have an average size of about 1 to about 200 nm.

3. The method of claim 1, wherein the precipitation regions are formed by solid state chemical reaction.

4. The method of claim 1 wherein the provided elemental powders comprise nanoparticles.

5. The method of claim 1, further comprising modulation doping the semiconductor alloy thermoelectric material.

6. A method of forming a semiconductor alloy thermoelectric material, comprising: providing at least two different elemental powders; mechanically alloying the at least two different elemental powders to form a semiconductor alloy powder comprising semiconductor alloy nanoparticles; and compacting the semiconductor alloy powder under pressure and at an elevated temperature to generate the semiconductor alloy thermoelectric material with a ZT value greater than 1.2 for at least one temperature in a range of 400° C. to 1200° C.; wherein: a current is passed through the semiconductor alloy powder during the step of compacting; the semiconductor alloy thermoelectric material comprises randomly oriented grains having an average grain size below 5000 nm and precipitation regions having an average size of 1 nm to 100 nm; wherein the semiconductor alloy thermoelectric material comprises a silicon germanium based material; and the step of providing at least two different elemental powders comprises providing at least a silicon elemental powder and a germanium elemental powder.

7. The method of claim 6, wherein: of mechanically alloying comprises milling the at least two different elemental powders; the semiconductor alloy nanoparticles have an average size of about 1 to 200 nm.

8. The method of claim 6, wherein the precipitation regions are formed by solid state chemical reaction.

9. The method of claim 6, wherein the provided elemental powders comprise nanoparticles.

10. The method of claim 6, further comprising modulation doping the semiconductor alloy thermoelectric material.

11. A method of forming a semiconductor alloy thermoelectric material, comprising:
    providing a mixture of at least two different elemental powders each comprising elemental nanoparticles; and
    compacting the mixture under pressure and at an elevated temperature to alloy the elemental powders and to form the semiconductor alloy thermoelectric material with a ZT value greater than 1.2 for at least one temperature in a range of room temperature to 300° C.;
    wherein:
    a current is passed through the mixture during the step of compacting;
    the semiconductor alloy thermoelectric material comprises randomly oriented grains having an average grain size below 5000 nm and precipitation regions having an average size of 1 nm to 100 nm; wherein the semiconductor alloy thermoelectric material comprises a bismuth telluride or bismuth antimony telluride based material; and the step of providing a mixture of at least two different elemental powders comprises providing at least a bismuth elemental powder and a tellurium elemental powder, or a bismuth elemental powder, an antimony elemental powder and a tellurium elemental powder.

12. The method of claim 11, wherein the elemental nanoparticles have an average size of about 1 to about 200 nm.

13. A method of forming a semiconductor alloy thermoelectric material, comprising: providing a mixture of at least two different elemental powders each comprising elemental nanoparticles; and compacting the mixture under pressure and at an elevated temperature to alloy the elemental powders and to form the semiconductor alloy thermoelectric material with a ZT value greater than 1.2 for at least one temperature in a range of 400° C. to 1200° C.; wherein a current is passed through the mixture during the step of compacting; the semiconductor alloy thermoelectric material comprises randomly oriented grains having an average grain size below 5000 nm and precipitation regions having an average size of 1 nm to 100 nm; wherein the semiconductor alloy thermoelectric material comprises a silicon germanium based material; and the step of providing a mixture of at least two different elemental powders comprises providing a mixture of at least a silicon elemental powder and a germanium elemental powder.

14. The method of claim 13, wherein the elemental nanoparticles have an average size of about 1 to about 200 nm.

15. A method of forming a semiconductor alloy thermoelectric material, comprising:
providing a semiconductor alloy powder comprising semiconductor alloy nanoparticles; and
compacting the semiconductor alloy powder under pressure and at an elevated temperature while passing a current through the semiconductor powder to generate the semiconductor alloy thermoelectric material with a ZT value greater than 1.2 for at least one temperature in a range of room temperature to 300° C.;
wherein the semiconductor alloy thermoelectric material comprises randomly oriented grains having an average grain size below 5000 nm and precipitation regions having an average size of 1 nm to 100 nm; and wherein the semiconductor alloy thermoelectric material comprises a bismuth telluride or bismuth antimony telluride based material.

16. The method of claim 15, wherein the semiconductor alloy nanoparticles have an average size of about 1 to about 200 nm.

17. The method of claim 15, wherein the precipitation regions are formed by solid state chemical reaction.

18. A method of forming a semiconductor alloy thermoelectric material, comprising: providing a semiconductor alloy powder comprising semiconductor alloy nanoparticles; and compacting the semiconductor alloy powder under pressure and at an elevated temperature while passing a current through the semiconductor powder to generate the semiconductor alloy thermoelectric material with a ZT value greater than 1.2 for at least one temperature in a range of 400° C. to 1200° C.; wherein the semiconductor alloy thermoelectric material comprises randomly oriented grains having an average grain size below 5000 nm and precipitation regions having an average size of 1 nm to 100 nm; and wherein the semiconductor alloy thermoelectric material comprises a silicon germanium based material.

19. The method of claim 18, wherein the semiconductor alloy nanoparticles have an average size of about 1 to about 200 nm.

20. The method of claim 18, wherein the precipitation regions are formed by solid state chemical reaction.

* * * * *